(12) United States Patent
Shimomura et al.

(10) Patent No.: US 9,830,968 B2
(45) Date of Patent: *Nov. 28, 2017

(54) SPIN ORBIT TORQUE (SOT) MAGNETIC MEMORY CELL AND ARRAY

(71) Applicant: Kabushiki Kaisha Toshiba, Minato-ku (JP)

(72) Inventors: Naoharu Shimomura, Meguro (JP); Yoshiaki Asao, Tsukuba (JP); Takamitsu Ishihara, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/266,120

(22) Filed: Sep. 15, 2016

(65) Prior Publication Data
US 2017/0270985 A1  Sep. 21, 2017

(30) Foreign Application Priority Data
Mar. 16, 2016 (JP) ................. 2016-053011

(51) Int. Cl.
*G11C 11/16* (2006.01)
*H01L 27/22* (2006.01)
(Continued)

(52) U.S. Cl.
CPC ........ *G11C 11/161* (2013.01); *G11C 11/1673* (2013.01); *G11C 11/1675* (2013.01);
(Continued)

(58) Field of Classification Search
CPC ............. G11C 11/161; G11C 11/1673; G11C 11/1675; H01L 27/228; H01L 43/02; H01L 43/08
(Continued)

(56) References Cited

U.S. PATENT DOCUMENTS 5,991,193 A * 11/1999 Gallagher ............... G11C 11/15
365/171
6,909,628 B2 * 6/2005 Lin .......................... G11C 11/16
365/158

(Continued)

FOREIGN PATENT DOCUMENTS

CN         104393169 A       3/2015
JP         2013-232497       11/2013
(Continued)

*Primary Examiner* — Vu Le
*Assistant Examiner* — Sung Cho
(74) *Attorney, Agent, or Firm* — Oblon, McClelland, Maier & Neustadt, L.L.P.

(57) ABSTRACT

A magnetic memory according to an embodiment includes: at least one memory cell, the memory cell comprising: a conductive layer including a first terminal, a second terminal, and a portion located between the first terminal and the second terminal; a magnetoresistive element including: a first magnetic layer; a second magnetic layer between the portion and the first magnetic layer; and a nonmagnetic layer between the first magnetic layer and the second magnetic layer; a diode including an anode and a cathode, one of the anode and the cathode being electrically connected to the first magnetic layer; and a transistor including third and fourth terminals and a control terminal, the third terminal being electrically connected to the first terminal.

14 Claims, 20 Drawing Sheets

(51) Int. Cl.
  *H01L 43/02* (2006.01)
  *H01L 43/08* (2006.01)
(52) U.S. Cl.
  CPC .......... *H01L 27/224* (2013.01); *H01L 27/228* (2013.01); *H01L 43/02* (2013.01); *H01L 43/08* (2013.01)
(58) Field of Classification Search
  USPC .................. 365/158, 173, 175; 257/421, 295
  See application file for complete search history.

(56) References Cited

U.S. PATENT DOCUMENTS

| | | | |
|---|---|---|---|
| 9,042,157 B2 * | 5/2015 | Guillemenet | G11C 11/16 365/148 |
| 9,218,864 B1 * | 12/2015 | Yi | G11C 11/161 |
| 9,240,799 B1 * | 1/2016 | Wang | H03M 1/142 |
| 9,269,415 B1 * | 2/2016 | Liu | H01L 43/08 |
| 9,502,643 B2 | 11/2016 | Bae et al. | |
| 2003/0107914 A1 * | 6/2003 | Kang | G11C 11/15 365/158 |
| 2003/0218905 A1 * | 11/2003 | Perner | G11C 11/16 365/173 |
| 2003/0223283 A1 * | 12/2003 | Kunikiyo | G11C 11/16 365/200 |
| 2004/0257868 A1 * | 12/2004 | Tang | G11C 11/16 365/173 |
| 2006/0024886 A1 * | 2/2006 | Ferrant | H01L 27/224 438/257 |
| 2006/0221675 A1 * | 10/2006 | Hynes | G11C 11/16 365/158 |
| 2008/0186759 A1 * | 8/2008 | Shimizu | G11C 11/16 365/158 |
| 2009/0161265 A1 * | 6/2009 | Sugano | G01R 33/1284 360/324 |
| 2010/0014347 A1 * | 1/2010 | Wang | G11C 11/16 365/171 |
| 2010/0097852 A1 * | 4/2010 | Chen | G11C 11/16 365/171 |
| 2011/0128778 A1 * | 6/2011 | Chen | G11C 11/16 365/158 |
| 2012/0075906 A1 * | 3/2012 | Ho et al. | G11C 11/16 365/148 |
| 2012/0314472 A1 * | 12/2012 | Chung | G11C 11/5678 365/96 |
| 2013/0077389 A1 * | 3/2013 | Kitagawa | G11C 11/16 365/158 |
| 2013/0121056 A1 * | 5/2013 | Liu | G11C 11/56 365/148 |
| 2013/0285176 A1 | 10/2013 | Suzuki et al. | |
| 2013/0334632 A1 * | 12/2013 | Park | H01L 27/224 257/421 |
| 2014/0056060 A1 * | 2/2014 | Khvalkovskiy | H01L 27/228 365/158 |
| 2014/0084398 A1 * | 3/2014 | Oguz | H01L 43/12 257/421 |
| 2014/0124882 A1 * | 5/2014 | Khalili Amiri | H01L 43/08 257/421 |
| 2014/0264513 A1 * | 9/2014 | De Brosse | H01L 43/065 257/295 |
| 2014/0312441 A1 * | 10/2014 | Guo | H01L 43/04 257/427 |
| 2015/0036415 A1 | 2/2015 | Di Pendina et al. | |
| 2015/0070981 A1 * | 3/2015 | Kumura | H01L 27/228 365/158 |
| 2015/0070983 A1 * | 3/2015 | Kumura | G11C 7/12 365/158 |
| 2015/0129995 A1 | 5/2015 | Wang et al. | |
| 2015/0214274 A1 | 7/2015 | Lee et al. | |
| 2015/0249096 A1 * | 9/2015 | Lupino | H01L 27/11898 257/203 |
| 2015/0348606 A1 | 12/2015 | Buhrman et al. | |
| 2016/0020250 A1 * | 1/2016 | Li | H01L 27/224 365/158 |
| 2016/0027842 A1 * | 1/2016 | Khalili Amiri | H01L 27/224 257/421 |
| 2016/0042778 A1 | 2/2016 | Manipatruni et al. | |
| 2016/0071587 A1 | 3/2016 | Di Pendina et al. | |
| 2016/0225423 A1 * | 8/2016 | Naik | H01L 43/08 |
| 2016/0225982 A1 * | 8/2016 | Guo | H01L 43/08 |
| 2016/0232958 A1 * | 8/2016 | Bandiera | H01F 10/3254 |
| 2016/0276006 A1 * | 9/2016 | Ralph | G11C 11/18 |
| 2016/0300999 A1 * | 10/2016 | Yi | H01L 43/10 |
| 2017/0077177 A1 | 3/2017 | Shimomura et al. | |

FOREIGN PATENT DOCUMENTS

| | | |
|---|---|---|
| JP | 2013-243336 A | 12/2013 |
| JP | 2014-45196 | 3/2014 |
| JP | 2015-534272 A | 11/2015 |
| JP | 2017-59679 | 3/2017 |
| TW | 201543727 A | 11/2015 |
| WO | WO 2014/043631 A1 | 3/2014 |
| WO | WO 2016/011435 A1 | 1/2016 |

* cited by examiner

SPIN ORBIT TORQUE (SOT) MAGNETIC MEMORY CELL AND ARRAY

CROSS REFERENCE TO RELATED APPLICATIONS

This application is based upon and claims the benefit of priority from the prior Japanese Patent Application No. 2016-053011, filed on Mar. 16, 2016, the entire contents of which are incorporated herein by reference.

FIELD

Embodiments described herein relate generally to magnetic memories.

BACKGROUND

A magnetoresistive random access memory (MRAM) is a nonvolatile magnetic memory capable of high-speed operation. Therefore, MRAMs are expected to serve as novel nonvolatile work memories, and are being developed by a large number of organizations. An MRAM includes a magnetic tunnel junction (MTJ) element as a storage element. The fundamental structure of an MTJ element is formed with three layers, which are a magnetic layer, an insulating layer, and another magnetic layer. One of the magnetic layers is called the storage layer, and the other one of the magnetic layers is called the reference layer. The intermediate insulating layer is called the tunnel barrier, and is formed with an insulating film that is very thin but can allow a tunneling current to flow.

In an MRAM including a MTJ element as a storage element, write and read operations are performed by applying current between the storage layer and the reference layer via the tunnel barrier. Therefore, the tunnel barrier might break at the time of writing, and read disturb might occur as the magnetization of the storage layer is switched at the time of data reading.

To counter this, SOT-MRAMs have been suggested. In an SOT-MRAM, the magnetization of the storage layer of an MTJ element is switched by a spin Hall effect or spin orbit torque (SOT), and thus, writing is performed. However, such an SOT-MRAM has the problem of an increased cell area, as will be described later.

DETAILED DESCRIPTION

Figure 1:
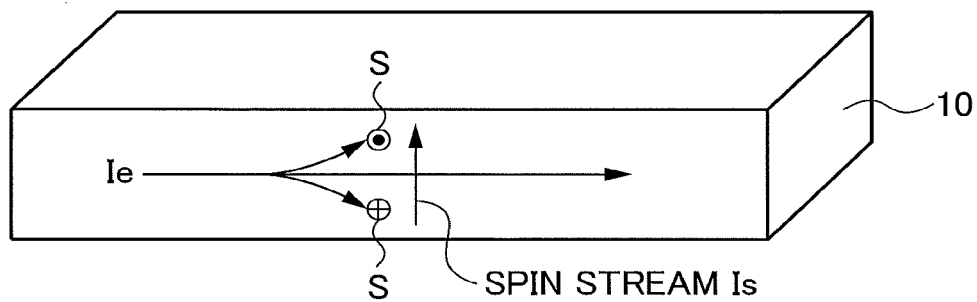
FIG. 1 is a diagram for explaining a spin Hall effect.

A magnetic memory according to an embodiment includes: at least one memory cell, the memory cell comprising: a conductive layer including a first terminal, a second terminal, and a portion located between the first terminal and the second terminal; a magnetoresistive element including: a first magnetic layer; a second magnetic layer between the portion and the first magnetic layer; and a nonmagnetic layer between the first magnetic layer and the second magnetic layer; a diode including an anode and a cathode, one of the anode and the cathode being electrically connected to the first magnetic layer; and a transistor including third and fourth terminals and a control terminal, the third terminal being electrically connected to the first terminal.

The following is a description of an embodiment, with reference to the accompanying drawings.

First, the background to the development of the present invention is explained before an embodiment of the present invention is described.

In an MRAM including an MTJ element as a storage element, the magnetization of the reference layer is fixed, and is always oriented in the same direction. On the other hand, the magnetization direction of the storage layer is changeable, and may be parallel or antiparallel to the magnetization direction of the reference layer. When the magnetization directions of the storage layer and the reference layer are parallel to each other, the electrical resistance between the storage layer and the reference layer via the tunnel barrier is low. When the magnetization directions of the storage layer and the reference layer are antiparallel to each other, the electrical resistance is high. This phenomenon in which the resistance value changes with the magnetization directions of magnetic members is called a magnetoresistive effect. An MRAM is a magnetic memory that stores "0" or "1" associated with the magnetization direction of the storage layer of an MTJ element, and reads the stored information about the magnetization direction by using a magnetoresistive effect.

When writing is performed on an MTJ element, the magnetization of the storage layer is switched. A principle called STT (Spin Transfer Torque) is used as the write method. By this method, current is applied from the storage layer to the reference layer, or from the reference layer to the storage layer, so that the spin moment of the reference layer is applied to the storage layer, and the magnetization direction of the storage layer becomes parallel or antiparallel to the magnetization direction of the reference layer. When current is applied from the storage layer to the reference layer, the spin torque acts in such a direction that the magnetization of the storage layer becomes parallel to the magnetization of the reference layer. When current is applied from the reference layer to the storage layer, the spin torque acts in such a direction that the magnetization of the storage layer becomes antiparallel to the magnetization of the reference layer.

A problem with STT writing lies in the fact that the tunnel barrier might break at the time of writing, since writing is performed by applying current to the tunnel barrier. Current is also applied at the time of data reading. Therefore, read disturb might occur, since the magnetization of the storage layer is switched by SIT when data is read.

An SOT-MRAM that switches the magnetization of the storage layer of an MTJ element by using a spin Hall effect or SOT (Spin Orbit Torque) is known as a magnetic memory to solve the above problems. As shown in FIG. 1, a spin Hall effect is a phenomenon in which current is applied to a nonmagnetic layer 10 made of a material with a large spin-orbit interaction so that electrons having spin angular momenta (hereinafter also referred to simply as the spin) of the opposite orientations from each other are scattered in the opposite directions, and a spin current Is is generated. At this point, the spin s, the spin current Is, and the electron stream Ie (of the opposite direction from the current) satisfy the relationship:

$$Is \propto s \times Ie \qquad (1)$$

That is, the spin stream Is is proportional to the outer product of the spin s and the electron stream Ie.

Figure 2:
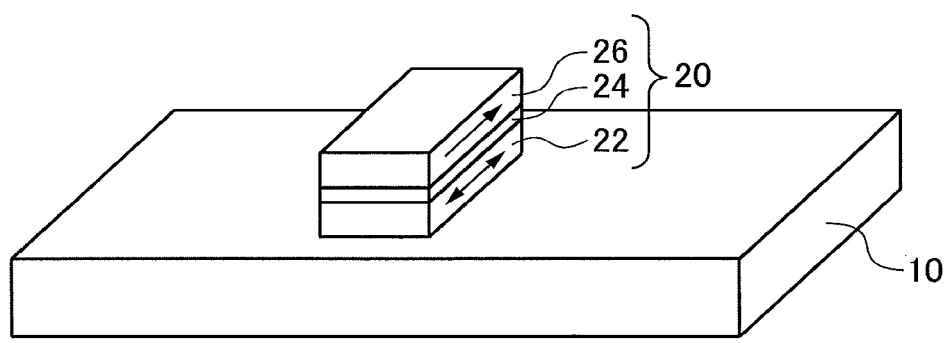
FIG. 2 is a diagram showing a storage element of an SOT-MRAM.

As shown in FIG. 2, a magnetoresistive element (an MTJ element, for example) 20 is stacked on the above described nonmagnetic layer 10. In this manner, spin torque (SOT) is applied to the storage layer 22 of the MTJ element 20 by virtue of the spin current generated in the nonmagnetic layer 10, and the magnetization of the storage layer 22 can be reversed. The MTJ element 20 includes the storage layer 22, a reference layer 26, and a nonmagnetic insulating layer 24 interposed between the storage layer 22 and the reference layer 26. When the polarity of the current being applied to the nonmagnetic layer 10 is switched, the spin torque (SOT) acting on the storage layer 22 of the MTJ element 20 is also reversed. That is, this current is controlled so that the magnetization direction of the storage layer 22 can be adjusted to a desired direction that is parallel or antiparallel to the magnetization direction of the reference layer 26. An MRAM that performs writing by using this principle is called an SOT-MRAM.

Figure 3:
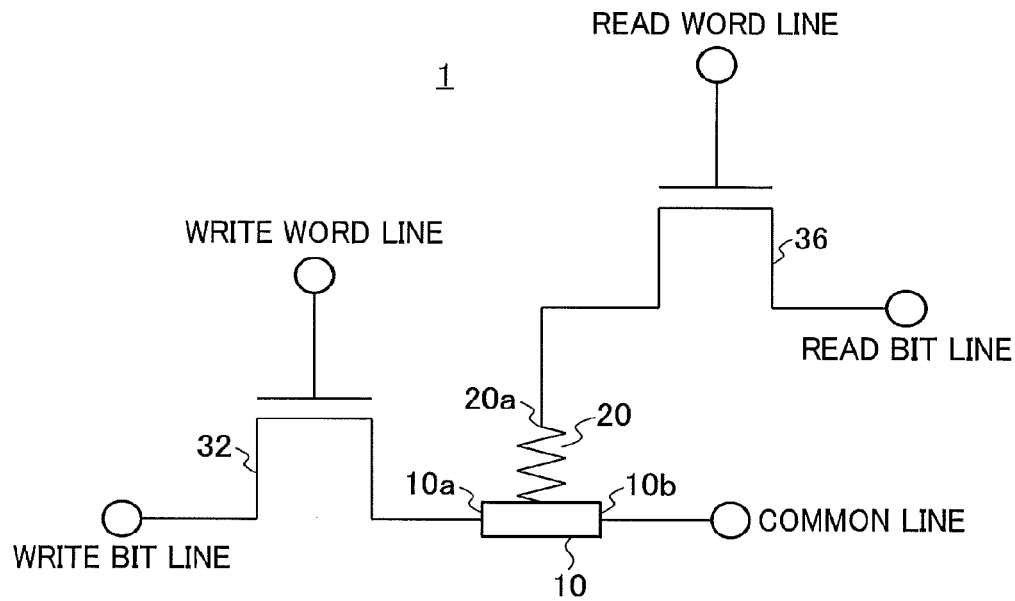
FIG. 3 is an equivalent circuit diagram of a unit cell of an SOT-MRAM.

An SOT-MRAM includes at least one memory cell, and an example of the equivalent circuit of this memory cell 1 is shown in FIG. 3. The MTJ element 20 is stacked on the nonmagnetic layer 10. As shown in FIG. 2, the storage layer 22 of the MTJ element 20 is located on the side of the nonmagnetic layer 10, and the reference layer 26 is disposed on the opposite side from the nonmagnetic layer 10. A transistor 32 is connected to a terminal 10a that is one of the two terminals of the nonmagnetic layer 10, and a transistor 36 is connected to a terminal 20a of the MTJ element 20 on the side of the reference layer 26.

Meanwhile, a terminal 10b of the nonmagnetic layer 10 on the side to which any transistor is not connected is a common terminal. With this structure, each memory cell of the SOT-MRAM has three terminals, and therefore, two or three transistors need to be connected to each memory cell as shown in FIG. 3. As a result, the area of each memory cell becomes larger, and the smallest limit of the cell size is approximately 12 $F^2$.

To counter this, the inventors have made intensity studies, and successfully invented a magnetic memory with a reduced cell size. This magnetic memory is described below as an embodiment.

(Embodiment)

Figure 4:
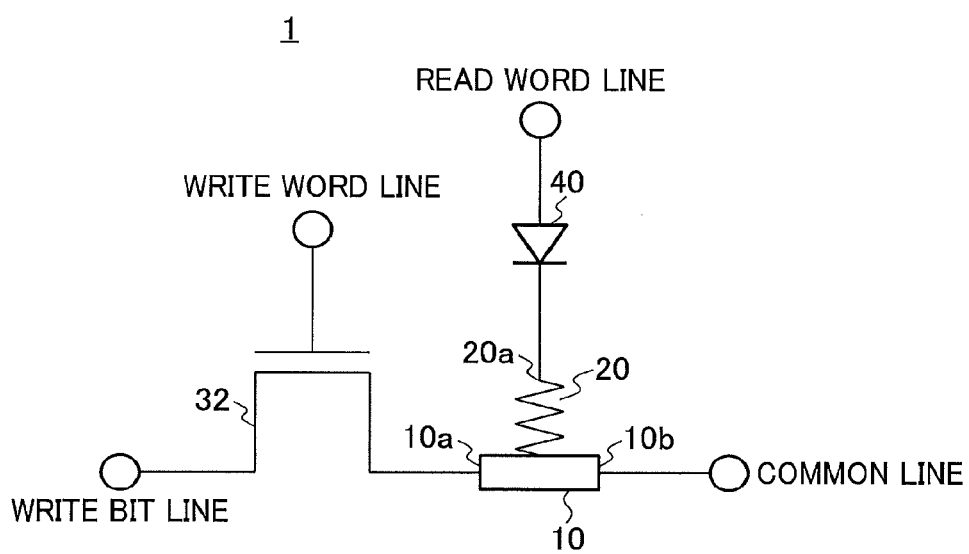
FIG. 4 is an equivalent circuit diagram of a unit cell of an SOT-MRAM according to an embodiment.

A magnetic memory according to an embodiment is an SOT-MRAM that includes at least one memory cell. This memory cell is shown in FIG. 4. The memory cell 1 of this embodiment includes a nonmagnetic layer (conductive layer) 10, a magnetoresistive element 20 disposed on the nonmagnetic layer 10, a transistor 32, and a diode 40. The magnetoresistive element 20 is an MTJ element, for example, and, as shown in FIG. 2, includes a storage layer 22 provided on the nonmagnetic layer 10, a reference layer 26 provided above the storage layer 22, and a nonmagnetic insulating layer 24 interposed between the storage layer 22 and the reference layer 26. The nonmagnetic layer 10 includes two terminals 10a and 10b. The terminal 10b of the nonmagnetic layer 10 is a common terminal. Although an MTJ element is used as the storage element 20 in the above description, the storage element 20 may be a giant magnetoresistive (GMR) element or a magnetoresistive element using a nonmagnetic metal layer in place of the nonmagnetic insulating layer 24.

The transistor 32 has one terminal of the source and the drain connected to the terminal 10a of the nonmagnetic layer 10, has the other terminal connected to a bit line, and has the gate (also called the control terminal) connected to a write word line.

The diode 40 has the anode connected to a read word line, and has the cathode electrically connected to the reference layer of the MTJ element 20. Here, "electrically connected" means that the cathode and the reference layer may be connected directly to each other, and some other conductor may exist between the cathode and the reference layer. The diode 40 may be connected in the opposite manner from that shown in FIG. 4. In that case, the cathode is connected to the read word line, and the anode is electrically connected to the reference layer of the MTJ element 20. When the write and read operations described later are performed on a memory cell $1_{11}$ in this case, the same operations as described later can be performed if the polarities of the voltages to be applied to a word line $WL2_1$ and bit lines $BL1_1$ and $BL2_1$ are reversed from the respective polarities of a case where the connections are made as shown in FIG. 4.

In this embodiment, one diode 40 and one MTJ element 20 are connected to the nonmagnetic layer 10. The transistor 32 is connected to the terminal 10a of the nonmagnetic layer 10, and the diode 40 is connected to the reference layer side of the MTJ element 20. As the diode 40 is a thin-film diode, and the diode 40 and the MTJ element 20 are stacked, the size of the memory cell can be reduced to 6 $F^2$.

(Write Method)

Figure 5:
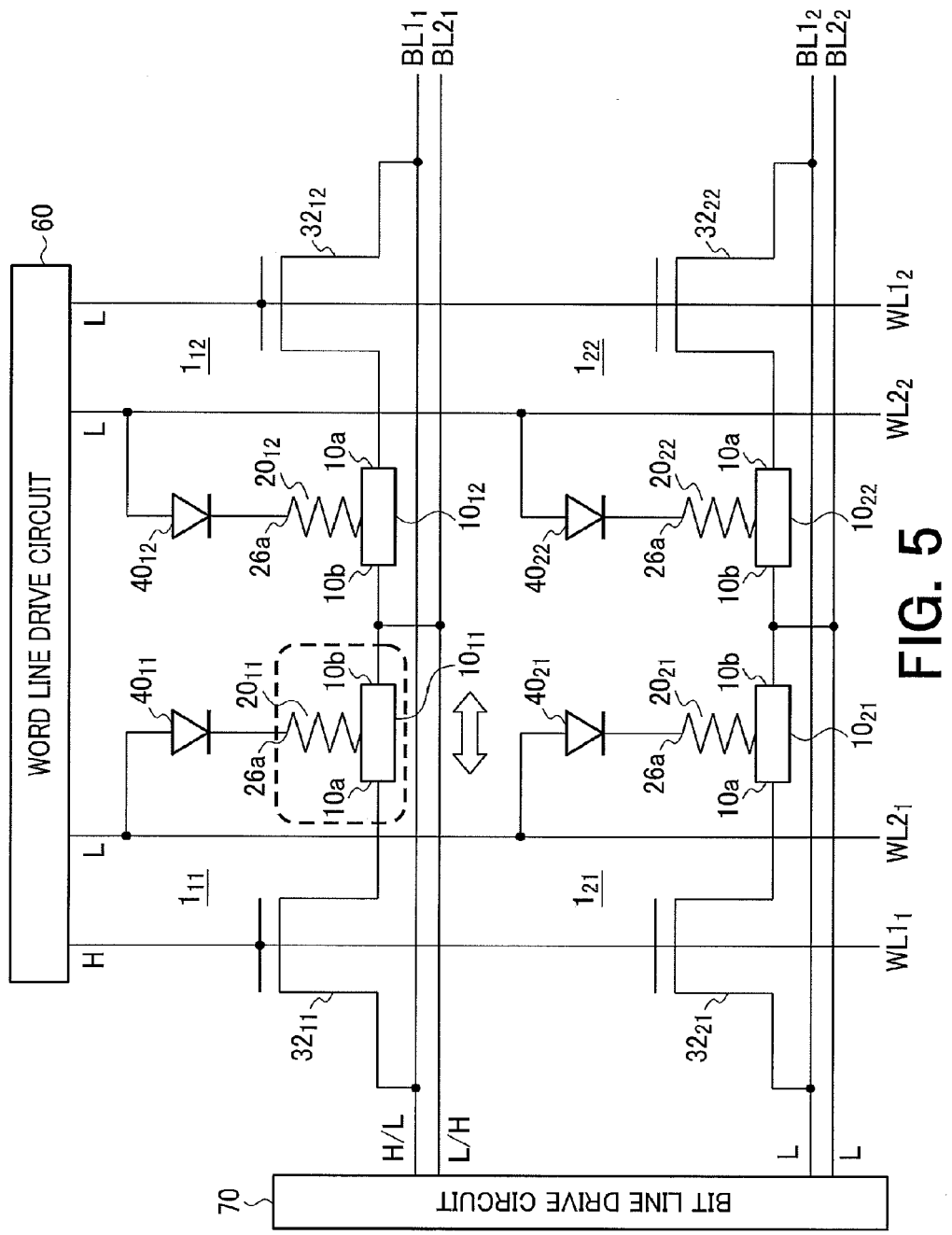
FIG. 5 is a diagram for explaining a write method in an SOT-MRAM according to the embodiment.

Referring now to FIG. 5, a write method in the magnetic memory according to this embodiment is described.

The magnetic memory shown in FIG. 5 includes 2×2 memory cells $1_{11}$ through $1_{22}$ arranged in a matrix form. Each memory cell $1_{ij}$ (i, j=1, 2) includes a nonmagnetic layer $10_{ij}$, a magnetoresistive element $20_{ij}$ disposed on the nonmagnetic layer $10_{ij}$, a transistor $32_{ij}$, and a diode $40_{ij}$. Each nonmagnetic layer $10_{ij}$ (i, j=1, 2) includes a first terminal 10a and a second terminal 10b.

The magnetoresistive element $20_{ij}$ (i, j=1, 2) is an MTJ element, for example, and has a structure in which a storage layer 22 is disposed on the nonmagnetic layer $10_{ij}$, a reference layer 26 is provided above the storage layer 22, and a nonmagnetic insulating layer 24 is interposed between the storage layer 22 and the reference layer 26, as shown in FIG. 2.

The transistor $32_{ij}$ (i, j=1, 2) has one terminal of the source and the drain connected to the first terminal $10a$ of the nonmagnetic layer $10_{ij}$, has the other terminal connected to a first bit line $BL1_i$, and has the gate connected to a first word line $WL1_j$.

The diode $40_{ij}$ (i, j=1, 2) has the anode connected to a second word line $WL2_j$, and has the cathode electrically connected to a terminal $26a$ of the reference layer of the MTJ element $20_{ij}$.

The second terminal $10b$ of the nonmagnetic layer $10_{ij}$ (i, j=1, 2) is connected to a second bit line $BL2_i$.

The first word lines $WL1_1$ and $WL1_2$, and the second word lines $WL2_1$ and $WL2_2$ are connected to a word line drive circuit 60, and are driven by the word line drive circuit 60. The first bit lines $BL1_1$ and $BL1_2$, and the second bit lines $BL2_1$ and $BL2_2$ are connected to a bit line drive circuit 70, and are driven by the bit line drive circuit 70. Both the word line drive circuit 60 and the bit line drive circuit 70 conduct write and read operations. The bit line drive circuit 70 includes a driver that applies a write current for performing a write operation to the first bit lines $BL1_1$ and $BL1_2$ or to the second bit lines $BL2_1$ and $BL2_2$, and a sinker that draws in the write current. The driver is connected to one end of each of the first bit lines $BL1_1$ and $BL1_2$ and/or the second bit lines $BL2_1$ and $BL2_2$, and the sinker is connected to the other end of each of the first bit lines $BL1_1$ and $BL1_2$ and/or the second bit lines $BL2_1$ and $BL2_2$.

A write method in an example case where writing is performed on the memory cell $1_{11}$ is now described. FIG. 5 shows the voltages to be applied to the first and second word lines to be driven by the word line drive circuit 60, and to the first and second bit lines to be driven by the bit line drive circuit 70 when this writing is performed.

When information "0" or "1" is to be written into the selected memory cell $1_{11}$, current is applied to the nonmagnetic layer $10_{11}$ in one of the directions that are the opposite of each other. For example, when the information "0" is to be written, the bit line drive circuit 70 drives the first bit line $BL1_1$ and the second bit line $BL2_1$ to apply current to the memory cell $1_{11}$ from left to right. When the information "1" is to be written, the bit line drive circuit 70 drives the first bit line $BL1_1$ and the second bit line $BL2_1$ to apply current to the memory cell $1_{11}$ from right to left. In the case of the "0" write to apply current to the nonmagnetic layer $10_{11}$ of the memory cell $1_{11}$ in FIG. 5, the first bit line $BL1_1$ is set at high level "H" (activated), and the second bit line $BL2_1$ is set at low level "L" (inactivated). The first bit line $BL1_2$ and the second bit line $BL2_2$, which are not connected to the selected memory cell $1_{11}$, are both set at low level "L". The first word line $WL1_1$ connected to the gate of the transistor $32_{11}$ in the selected memory cell $1_{11}$ is set at high level "H", to switch on the transistor $32_{11}$. The first word line other than the first word line $WL1_1$, or the first word line $WL1_2$, is set at low level "L", to switch off the transistors $32_{12}$ and $32_{22}$. The second word line $WL2_1$ connected to the diode $40_{11}$ sets the voltage at such a polarity as to apply a reverse bias to the diode $40_{11}$, and apply no current in a direction perpendicular to the film plane of the MT) element $20_{11}$. That is, in a case where the diode $40_{11}$ is connected in the direction shown in FIG. 5, the second word lines $WL2_1$ and $WL2_2$ are both set at low level "L". As the voltages are set in this manner, current flows into the nonmagnetic layer $10_{11}$ of the selected memory cell $1_{11}$ from left to right, and no current flows into the nonmagnetic layers $10_{12}$, $10_{21}$, and $10_{22}$ of the other memory cells $1_{12}$, $1_{21}$, and $1_{22}$.

Further, to apply current to the nonmagnetic layer $10_{11}$ from right to left so as to write "1" into the selected memory cell $1_{11}$, the potentials of the first bit line $BL1_1$ and the second bit line $BL2_1$ are switched, so that the first bit line $BL1_1$ is set at low level "L", and the second bit line $BL2_1$ is set at high level "H". The voltage of the other wiring lines is set at the same voltage as that in the "0" write operation, so that current flows into the nonmagnetic layer $10_{11}$ of the selected memory cell $1_{11}$ from right to left, and no current flows into the nonmagnetic layers $10_{12}$, $10_{21}$, and $10_{22}$ of the other memory cells $1_{12}$, $1_{21}$, and $1_{22}$.

(Read Method)

Figure 6:
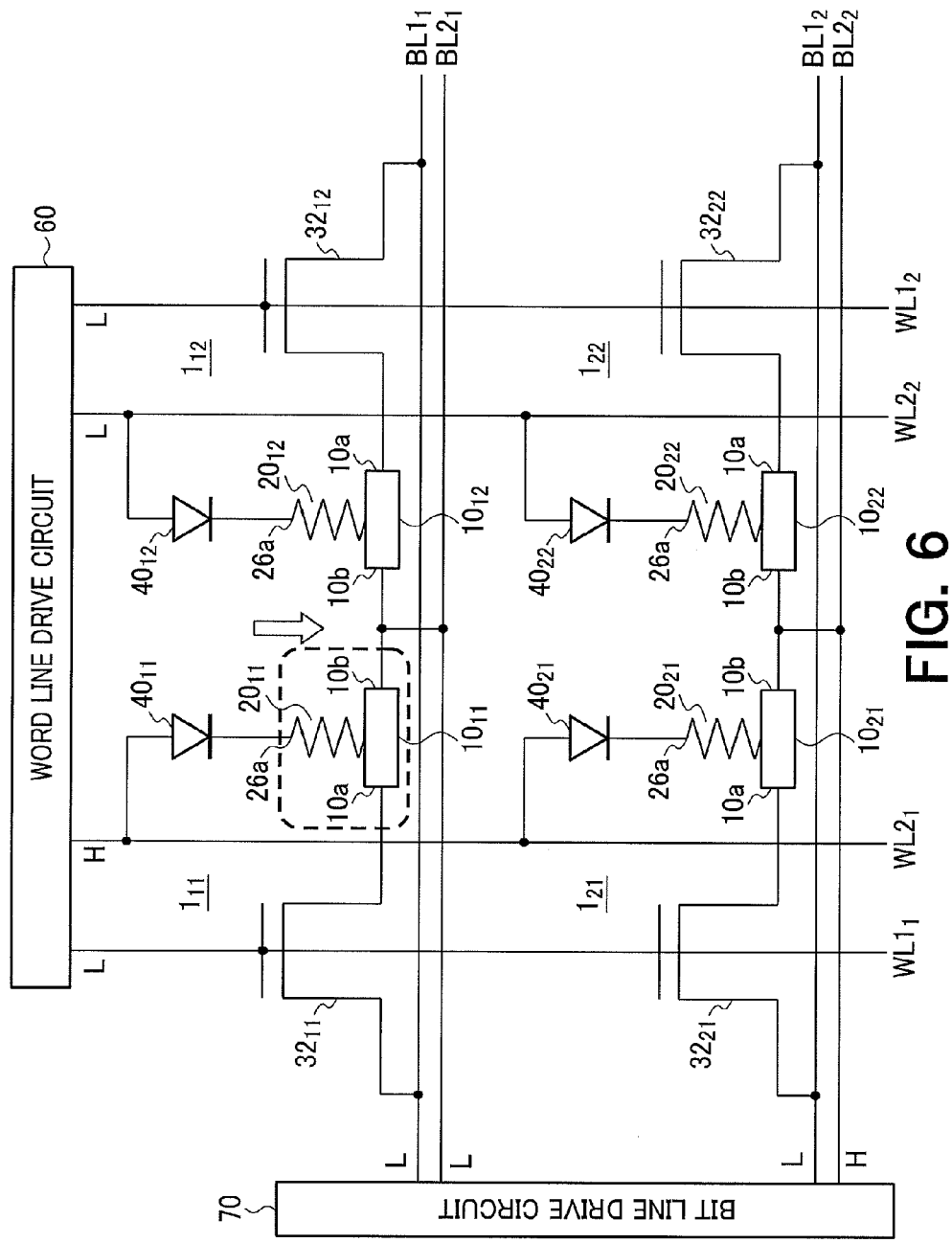
FIG. 6 is a diagram for explaining a read method in an SOT-MRAM according to the embodiment.

Referring now to FIG. 6, a read method in the magnetic memory according to this embodiment is described. FIG. 6 shows the voltages to be applied to the first and second word lines to be driven by the word line drive circuit 60, and to the first and second bit lines to be driven by the bit line drive circuit 70 in a read operation in the magnetic memory shown in FIG. 5.

In the example case described below, information is read from the memory cell $1_{11}$ by the read method of this embodiment. First, the memory cell $1_{11}$ is selected, and current is applied to this selected memory cell $1_{11}$ in the direction of the stacking of the storage layer, the nonmagnetic insulating layer, and the reference layer of the MTJ element. As a result, a forward current flows into the diode $40_{11}$ of the selected memory cell $1_{11}$, but no current flows into the unselected memory cells since a reverse bias is applied to the unselected memory cells. That is, the second write wiring line $WL2_1$ is set at high level "H", and the second write wiring line $WL2_2$ is set at low level "L", as shown in FIG. 6. Meanwhile, the first word lines $WL1_1$ and $WL1_2$ are set at low level "L", to switch off the transistors $32_{11}$ and $32_{22}$. The first bit line $BL1_1$ and the second bit line $BL2_1$, which are connected to the selected memory cell $1_{11}$, are both set at low level "L". As a result, current can be applied to the MTJ element $20_{11}$ of the selected memory cell $1_{11}$. As for the first bit line $BL1_2$ and the second bit line $BL2_2$, which are not connected to the selected memory cell $1_{11}$, the first bit line $BL1_2$ is set at low level "L", and the second bit line $BL2_2$ is set at high level "H". As the voltages are set in this manner, current can be applied to the MTJ element $20_{11}$ of the selected memory cell $1_{11}$, and data can be read from the MTJ element $20_{11}$.

As is apparent from the above description, the word line drive circuit 60 and the bit line drive circuit 70 serve as both write circuits and read circuits. The first word lines $WL1_1$ and $WL1_2$ serve as write word lines, and the second word lines $WL2_1$ and $WL2_2$ serve as read word lines. The first bit lines $BL1_1$ and $BL1_2$ serve as normal bit lines, and the second bit lines $BL2_1$ and $BL2_2$ serve as common bit lines.

The voltages to be applied to the respective wiring lines $WL1_1$, $WL1_2$, $WL2_1$, $WL2_2$, $BL1_1$, $BL1_2$, $BL2_1$, and $BL2_2$ in the write operation and the read operation shown in FIGS. 5 and 6 are based on the assumption that the select transistors $32_{11}$ through $32_{22}$ are n-channel MOS transistors.

As described above, this embodiment can provide memory cells with a reduced cell size, and a magnetic memory including the memory cells.

(Modification)

Figure 7:
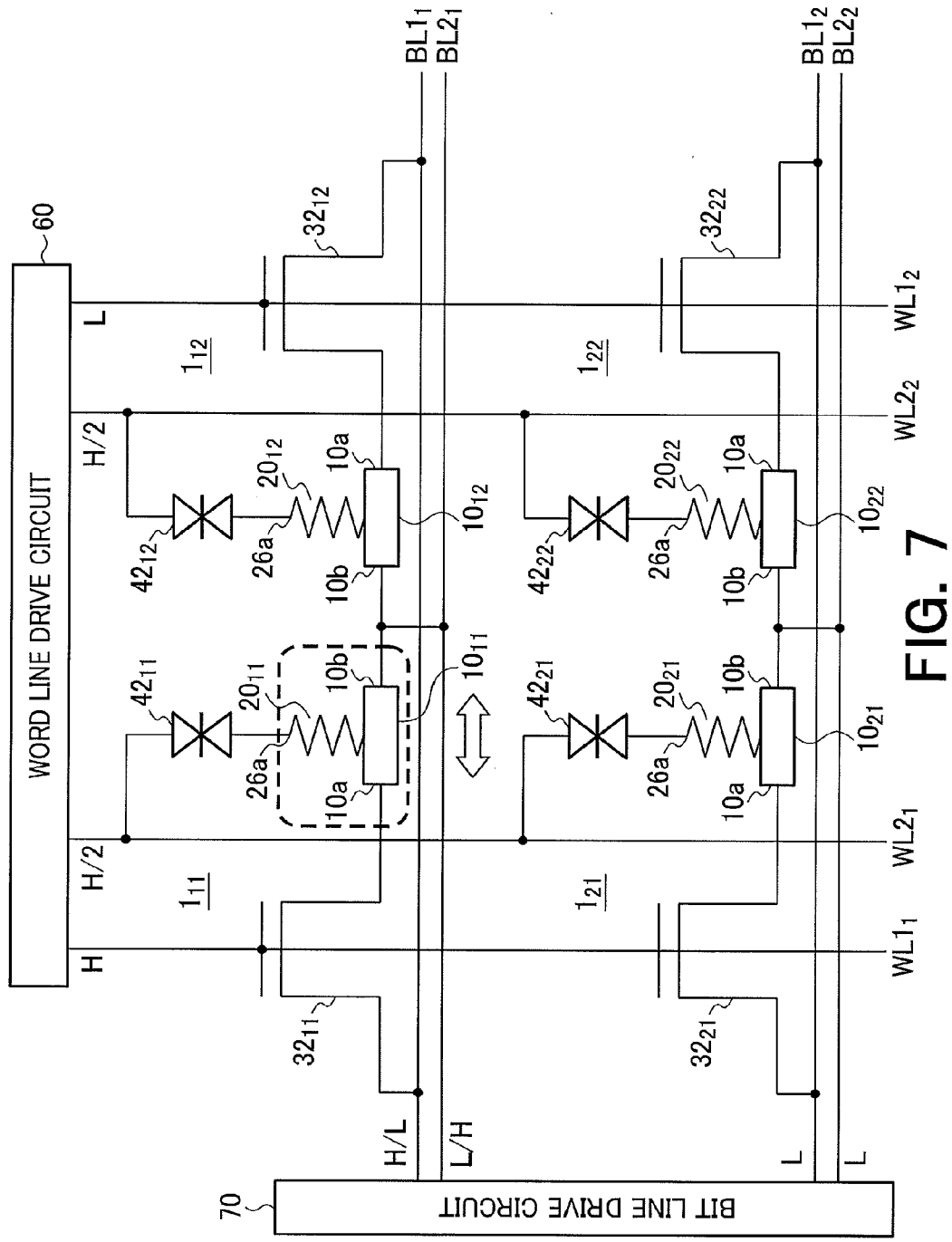
FIG. 7 is a diagram for explaining a write method in an SOT-MRAM according to a modification of the embodiment.
Figure 8:
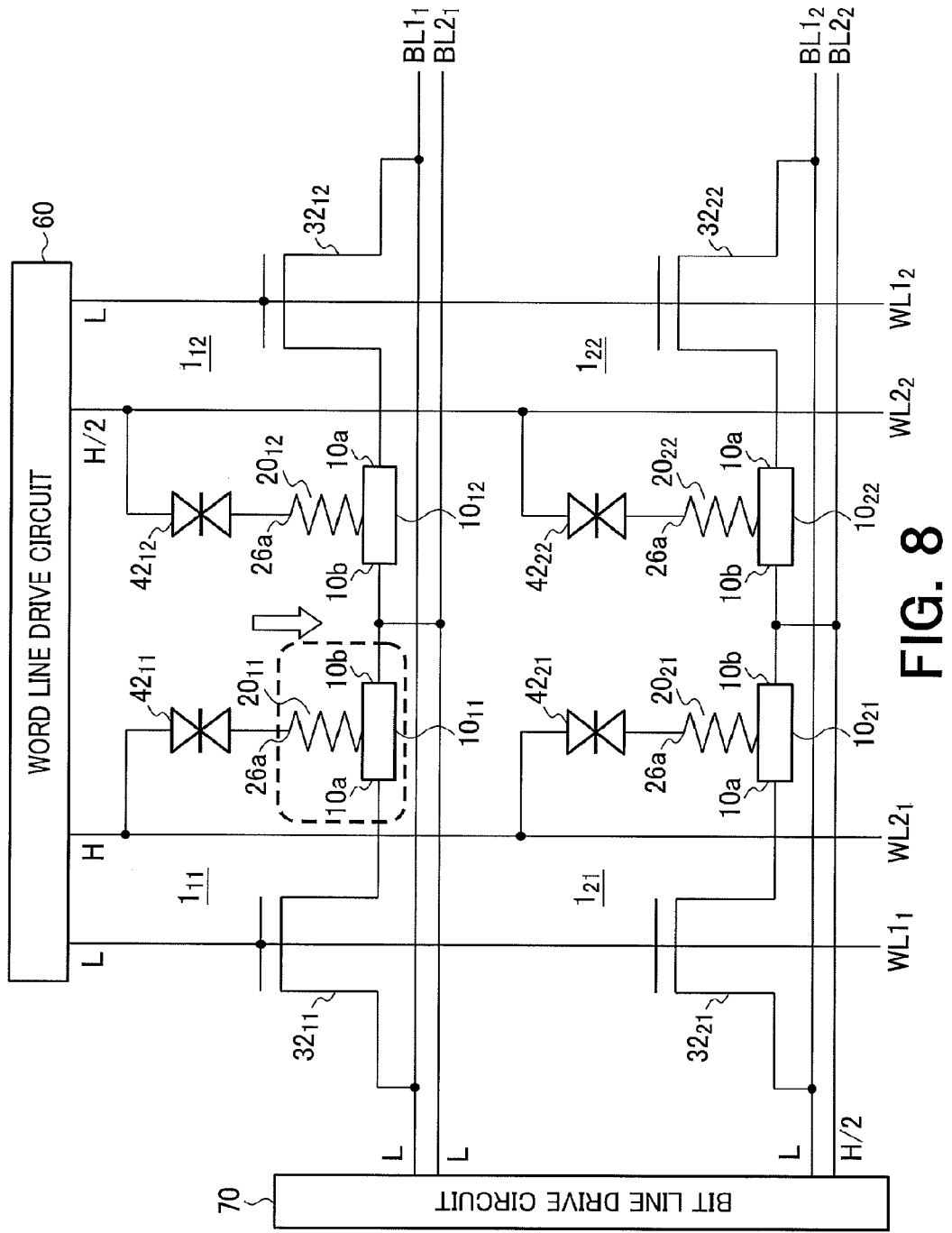
FIG. 8 is a diagram for explaining a read method in an SOT-MRAM according to the modification of the embodiment.

Referring now to FIGS. 7 and 8, a magnetic memory according to a modification of this embodiment is described. The magnetic memory of this modification is the same as the magnetic memory of this embodiment shown in FIGS. 5 and 6, except that the diodes $40_{11}$ through $40_{22}$ are replaced with bidirectional diodes $42_{11}$ through $42_{22}$, respectively. These bidirectional diodes $42_{11}$ through $42_{22}$ may be ovonic threshold switches (OTS), for example. FIG. 7 is a diagram showing the voltages to be applied to the first and second word lines, and to the first and second bit lines in a case where writing is to be performed on the memory cell $1_{11}$ of the magnetic memory of this modification. FIG. 8 is a diagram showing the voltages to be applied to the first and second word lines, and to the first and second bit lines in a case where data is to be read from the memory cell $1_{11}$ of the magnetic memory of this modification.

When the potential difference between the polarities of both sides exceeds a threshold, current can be applied to the bidirectional diodes $42_{11}$ through $42_{22}$. When the potential difference is not larger than the threshold, current is not applied to the bidirectional diodes $42_{11}$ through $42_{22}$.

As shown in FIG. 7, in setting the voltages in a write operation, the second word lines $WL2_1$ and $WL2_2$ to serve as read wiring lines are set at a potential of H/2, so that no current flows thereinto. Here, the potential of H/2 is half the potential of high level "H". The other aspects are the same as in the case shown in FIG. 5.

In a read operation, the second word line $WL2_2$ that is connected to the unselected memory cells and serves as a read wiring line, and the second bit line $BL2_2$ that is connected to the unselected memory cells and serves as a common bit line are set at H/2, as shown in FIG. 8. The other aspects are the same as in the case shown in FIG. 6.

Like the embodiment, this modification can also provide memory cells with a reduced cell size, and a magnetic memory including the memory cells.

(Manufacturing Method)

Referring now to FIGS. 9 through 16, a method of manufacturing the magnetic memory of this embodiment is described. This manufacturing method is designed to manufacture a magnetic memory that includes memory cells arranged in a matrix fashion as shown in FIG. 5.

Figure 9:
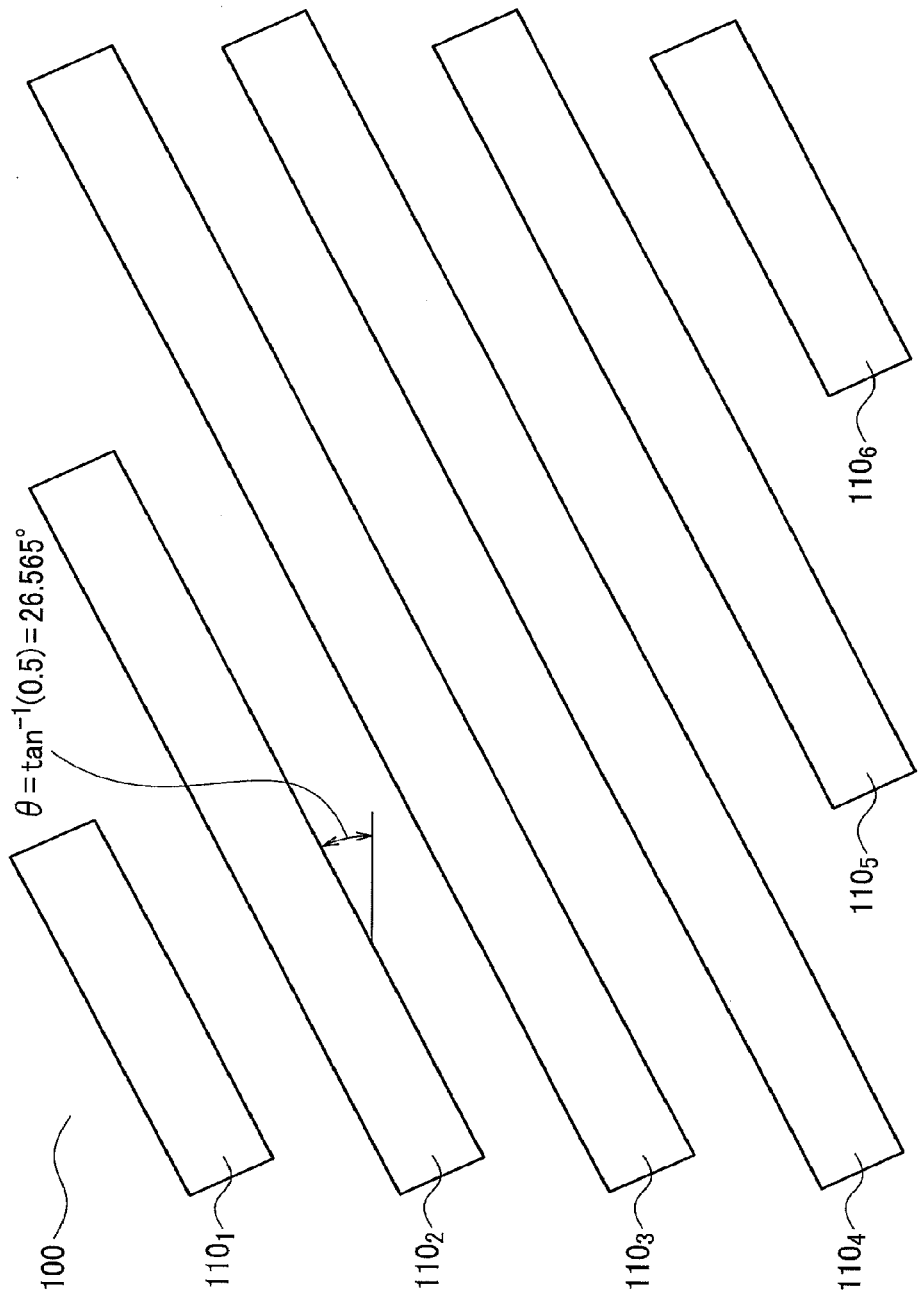
FIGS. 9 through 16 are plan views illustrating a procedure for manufacturing an SOT-MRAM according to an embodiment.

First, as shown in FIG. 9, active regions $110_1$ through $110_6$ for transistors are formed on a semiconductor layer 100. These active regions $110_1$ through $110_6$ turn into the source and drain regions of the transistors $32_{11}$ through $32_{22}$ of the memory cells $1_{11}$ through $1_{22}$ shown in FIG. 5. These active regions $110_1$ through $110_6$ extend in a direction at a predetermined angle $\Theta$ with respect to the direction (the transverse direction in the drawing) in which the first bit lines $BL1_1$ through $BL1_4$ described later with reference to FIG. 12 extend. This angle $\Theta$ is set at approximately $\tan^{-1}$ (0.5), or approximately 26 degrees. In this manner, the distance between the memory cells can be shortened, and the memory cell size can be reduced.

Figure 10:
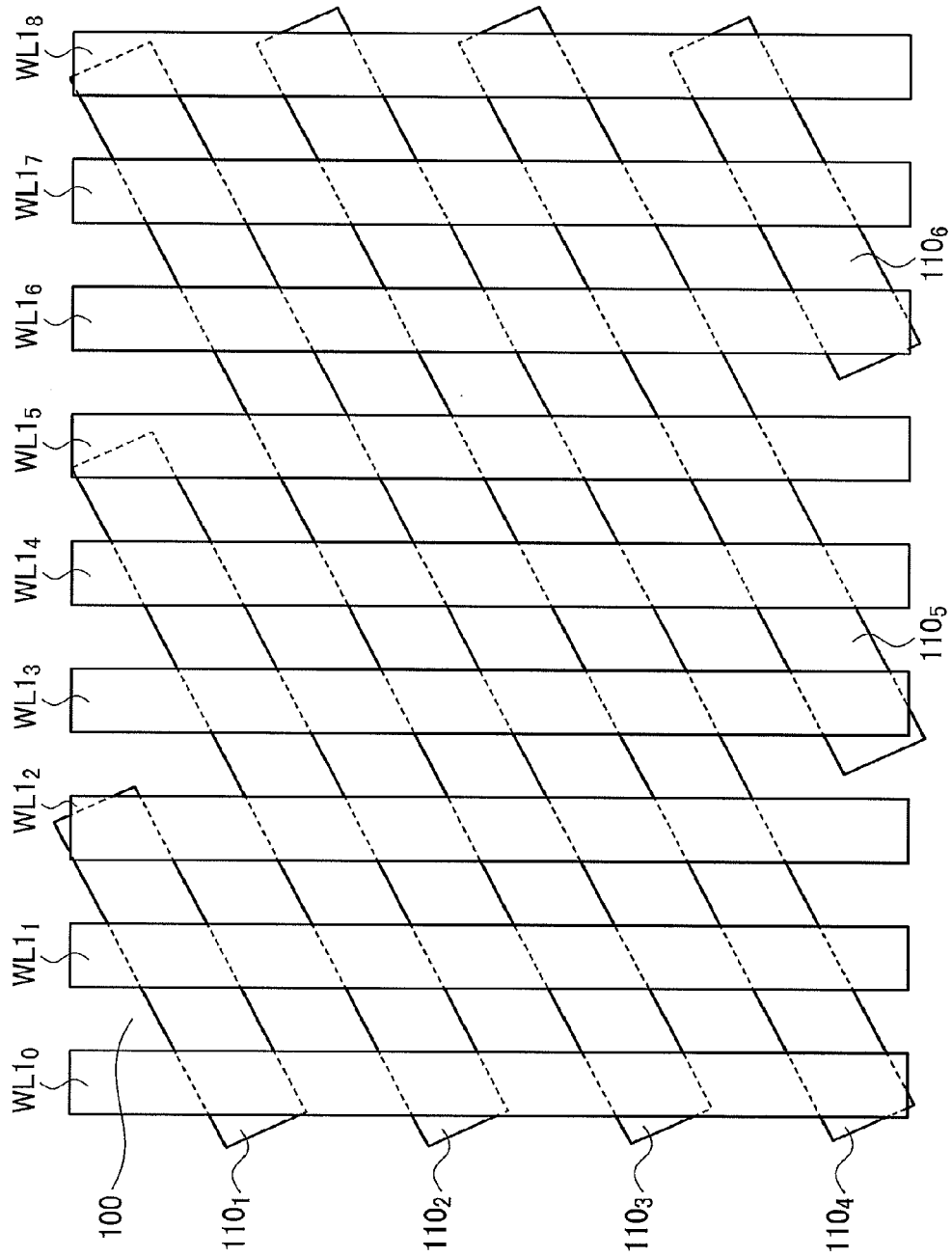

As shown in FIG. 10, first word lines $WL1_0$ through $WL1_8$ are then formed on the semiconductor layer 100 having the active regions $110_1$ through $110_6$ formed thereon. These first word lines $WL1_0$ through $WL1_8$ are formed in a direction that intersects with or is perpendicular to the direction (the transverse direction in the drawing) in which the first bit lines $BL1_1$ through $BL1_4$ described later with reference to FIG. 12 extend, for example.

Figure 11:
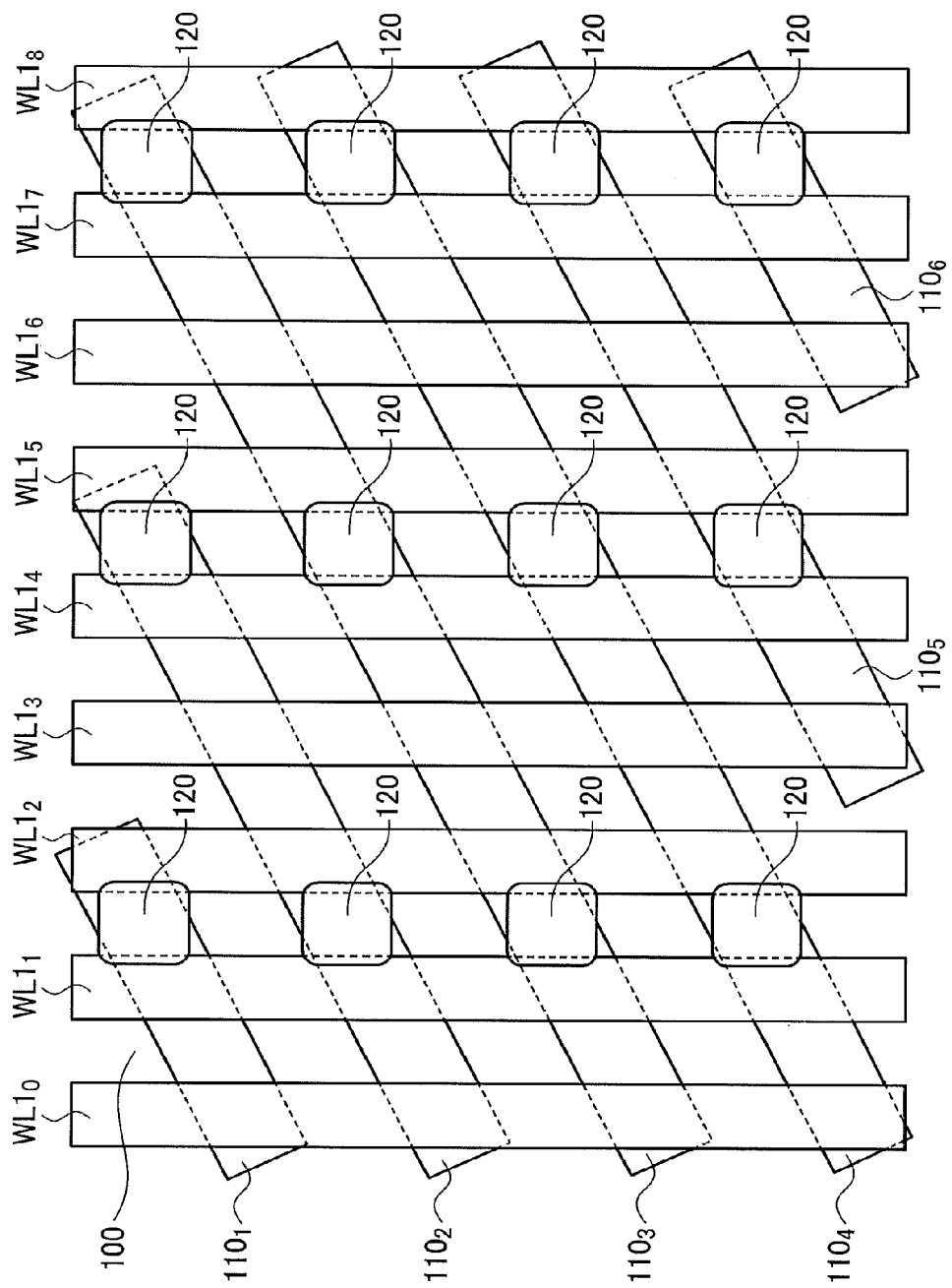
Figure 12:
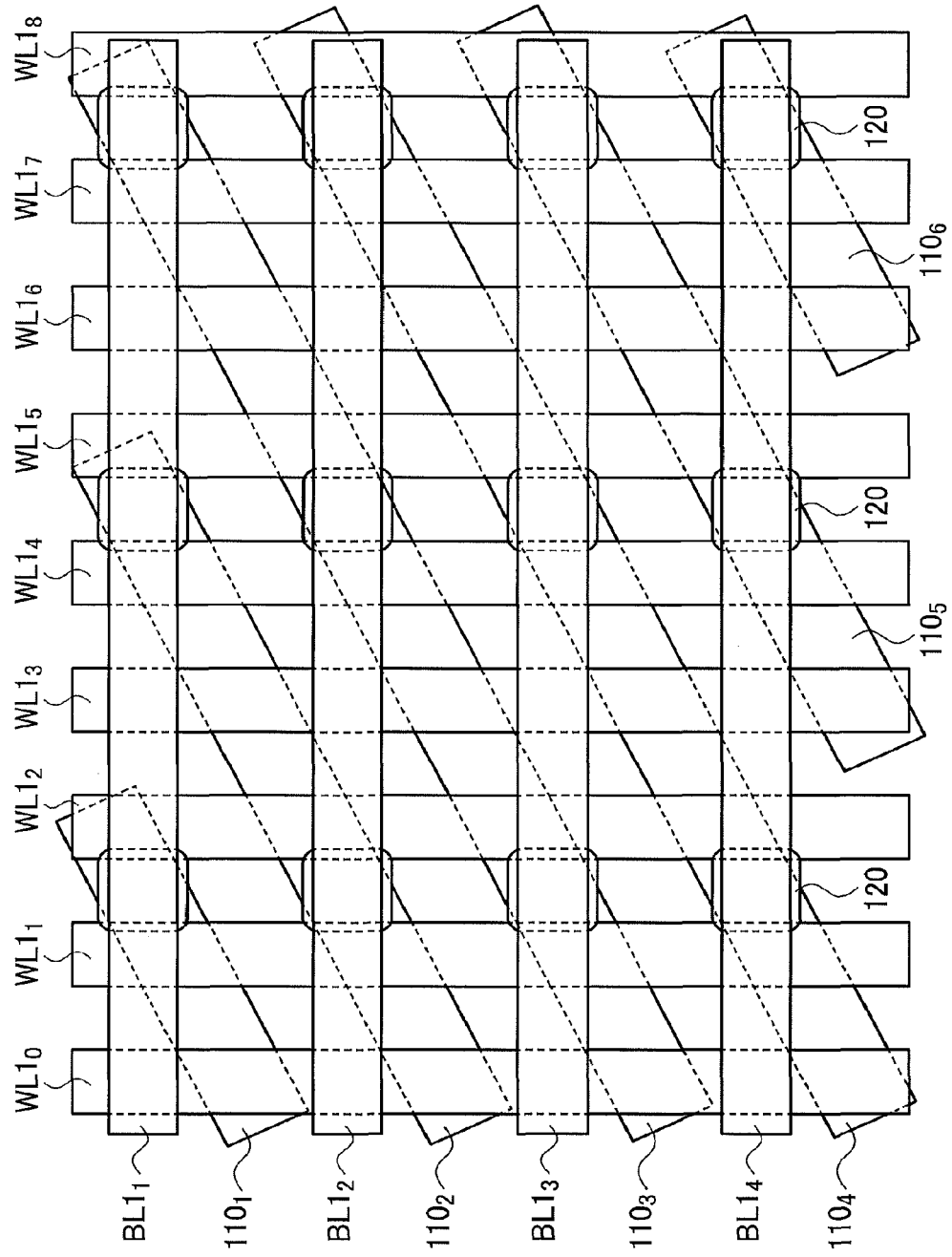

As shown in FIG. 11, contacts 120 that connect the transistors in the respective memory cells to the first bit lines $BL1_1$ through $BL1_4$ described later with reference to FIG. 12 are then formed. These contacts 120 are disposed in the regions that are located between the first word line $WL1_1$ and the first word line $WL1_2$, between the first word line $WL1_4$ and the first word line $WL1_5$, and between the first word line $WL1_7$ and the first word line $WL1_8$, and intersect with the active regions $110_1$ through $110_6$.

As shown in FIG. 12, the first bit lines $BL1_1$ through $BL1_4$ extending in a direction that intersects with or is perpendicular to the first word lines $WL1_0$ through $WL1_8$ are then formed, for example. These first bit lines $BL1_1$ through $BL1_4$ are connected to the active regions $110_1$ through $110_6$ via the contacts 120.

Figure 13:
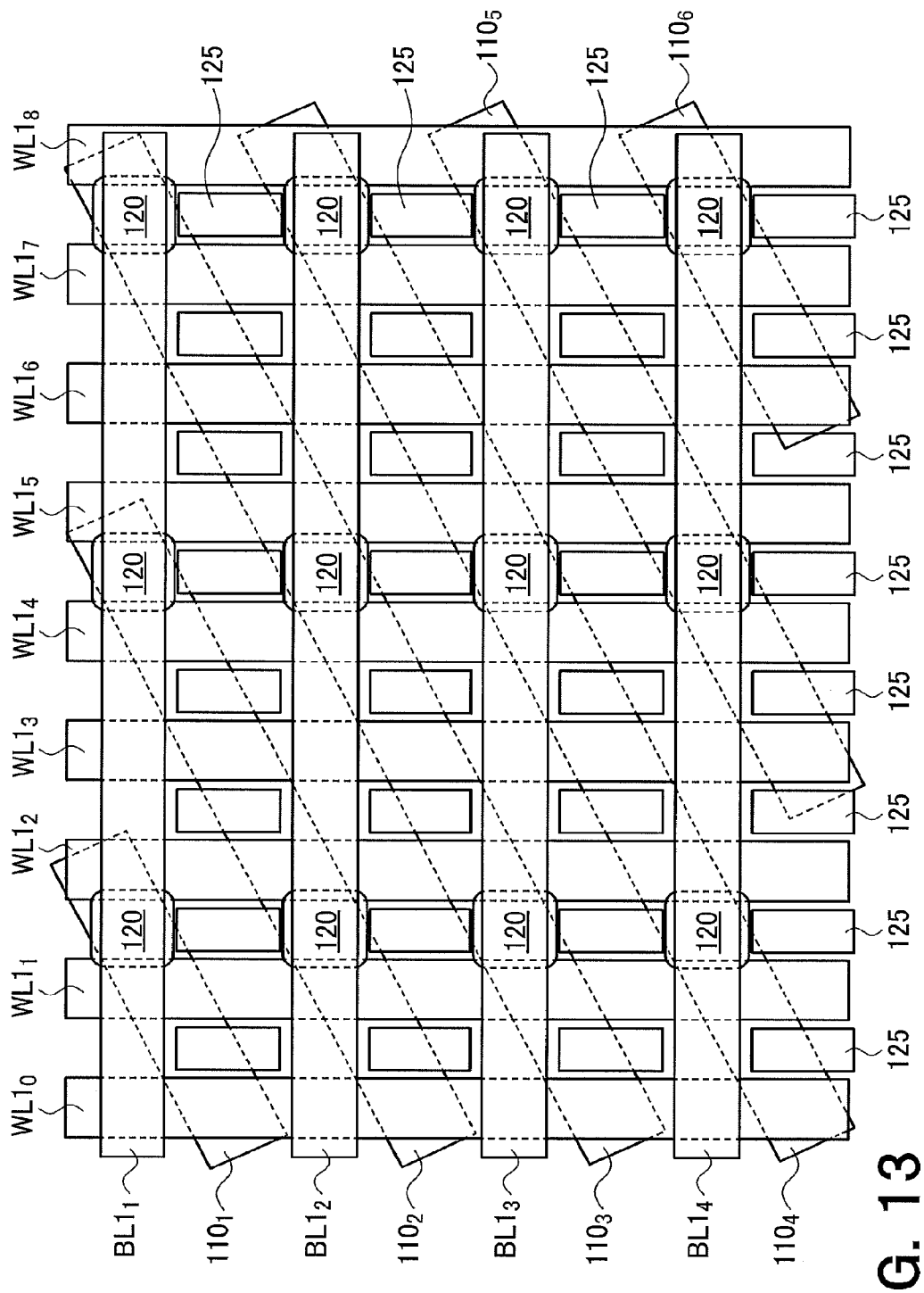

As shown in FIG. 13, contacts 125 that connect the transistors in the respective memory cells to the nonmagnetic layers 10 described later are then formed. These contacts 125 turn into the terminals 10a shown in FIG. 5. The contacts 125 are formed in the regions that are located between the adjacent first word lines and connect to the active regions $110_1$ through $110_6$.

Figure 14:
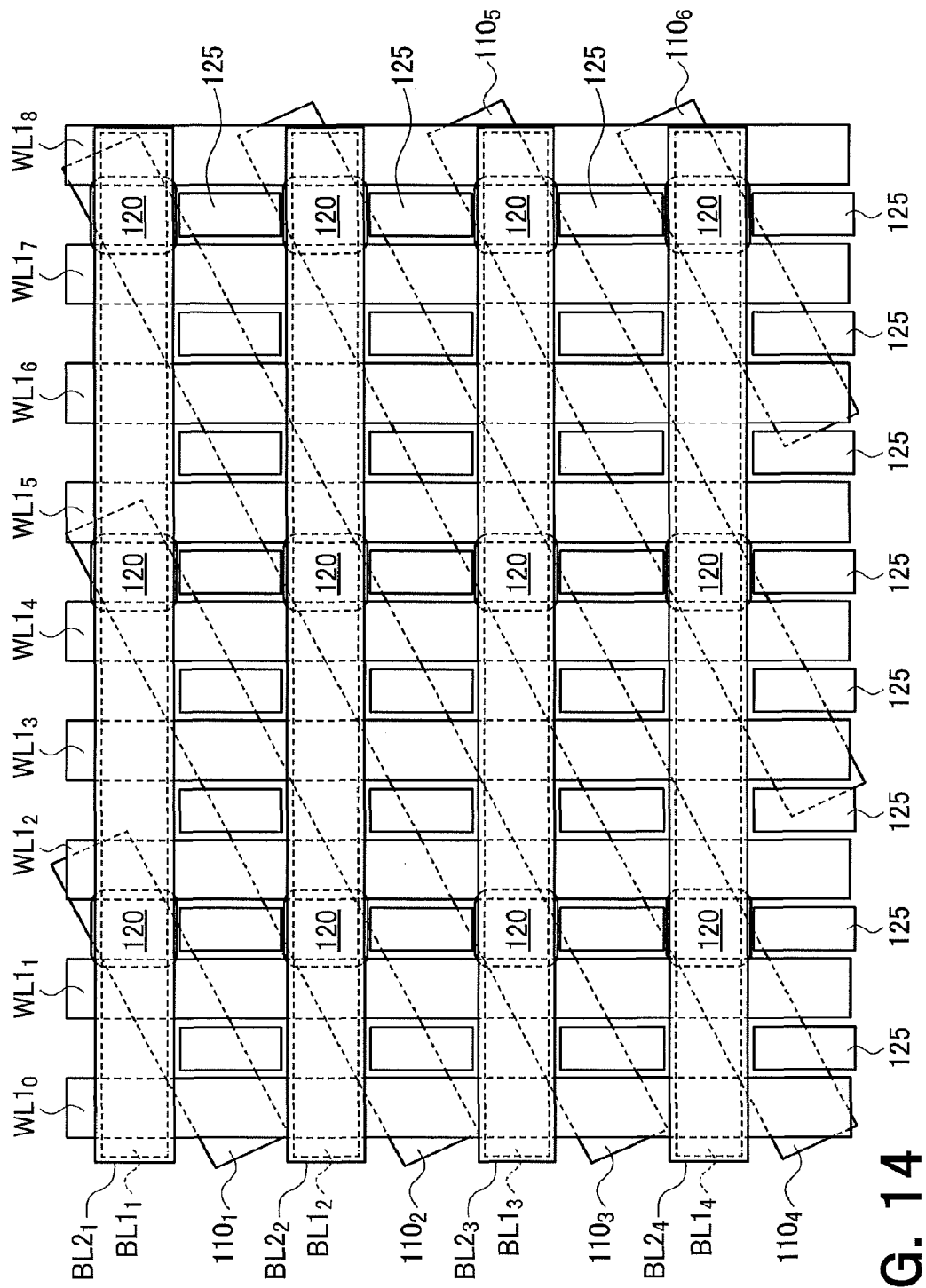

As shown in FIG. 14, second bit lines $BL2_1$ through $BL2_4$ are then formed above the first bit lines $BL1_1$ through $BL1_4$, respectively. In FIG. 14, each second bit line $BL2_j$ (j=1, . . . , 4) has a greater width than each corresponding first bit line $BL1_j$. However, each second bit line $BL2_j$ may have the same width as each corresponding first bit line $BL1_j$.

Figure 15:
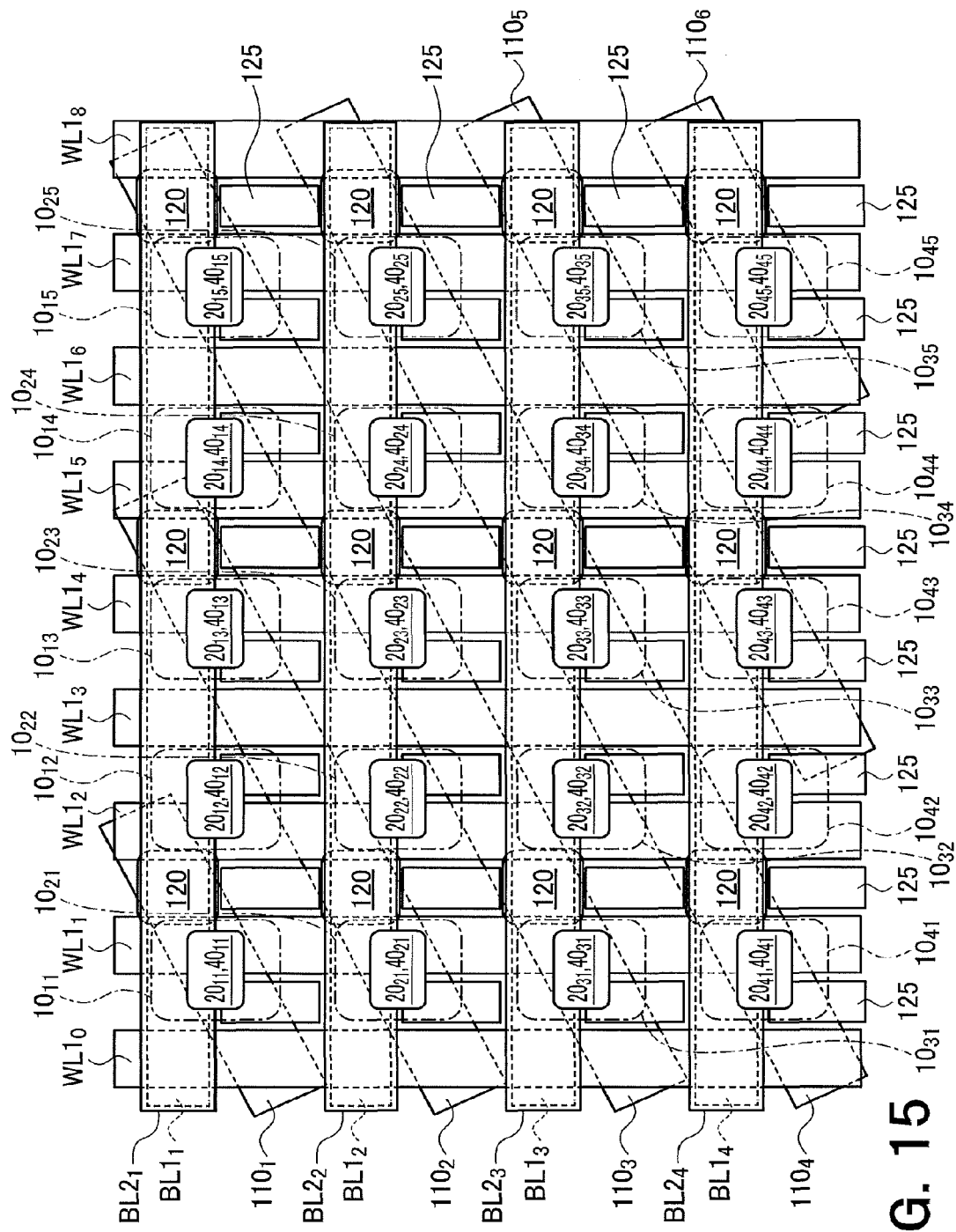

As shown in FIG. 15, the nonmagnetic layers $10_{11}$ through $10_{45}$ of the memory cells are then formed, the MTJ element $20_{ij}$ are formed on the respective nonmagnetic layers $10_{ij}$ (i=1, . . . , 4, j=1, . . . , 5), and the diodes $40_{ij}$ are formed on the respective MTJ elements $20_{ij}$. The nonmagnetic layers $10_{11}$ through $10_{45}$ are indicated by dashed lines, and the MTJ elements $20_{11}$ through $20_{45}$ are indicated by solid lines. The respective diodes $40_{ij}$ (i=1, . . . , 4, j=1, . . . , 5) overlap with the MTJ elements $20_{ij}$ in the drawing. The respective nonmagnetic layers $10_{ij}$ (i=1, . . . , 4, j=1, . . . , 5) are connected to the corresponding contacts 125 and to the corresponding second bit lines $BL2_j$.

Figure 16:
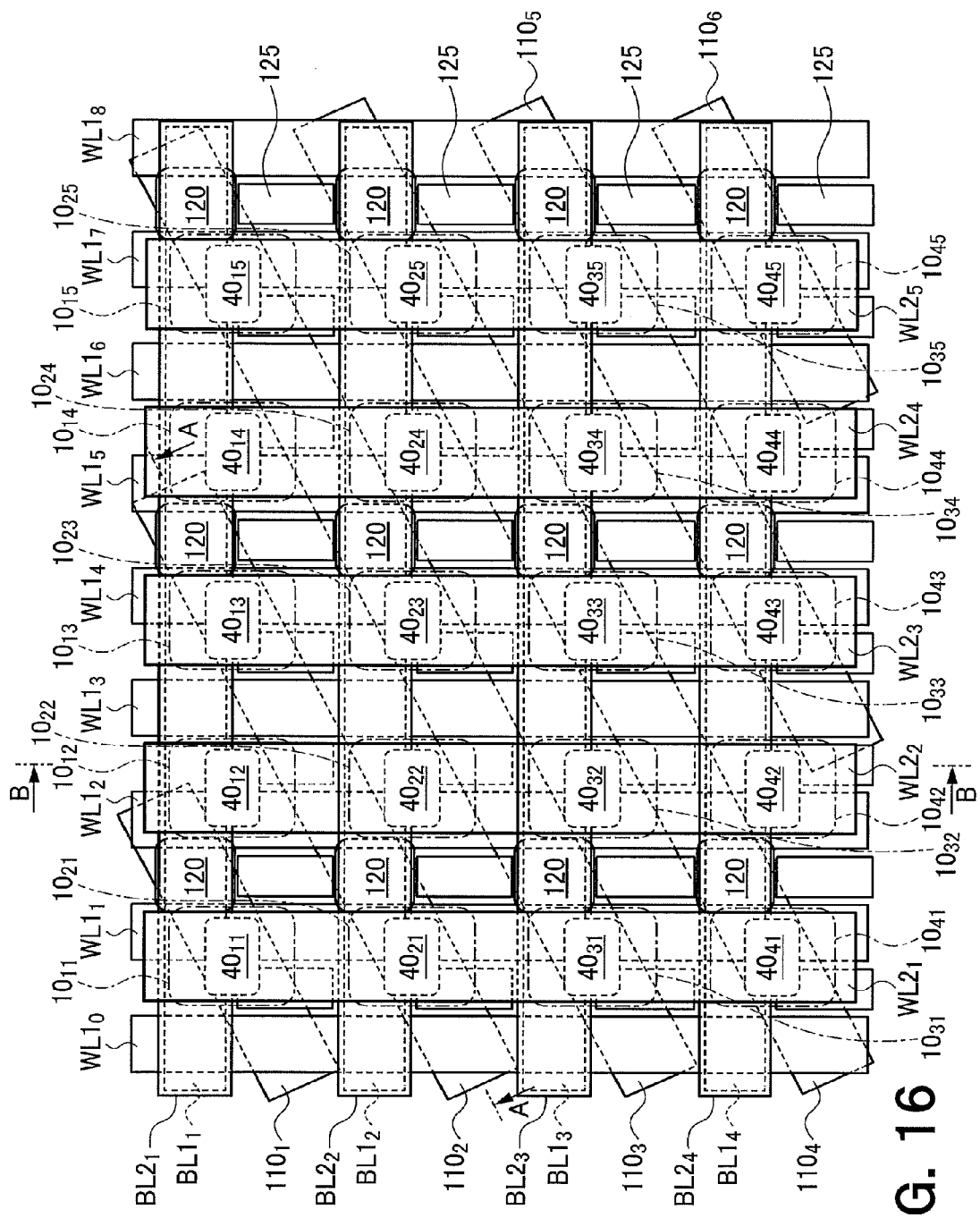

As shown in FIG. 16, second word lines $WL2_j$=1, . . . , 5) are then formed to connect to the diodes $40_{1j}$, $40_{2j}$, $40_{3j}$, and $40_{4j}$, which are arranged in the j columns.

Figure 17:
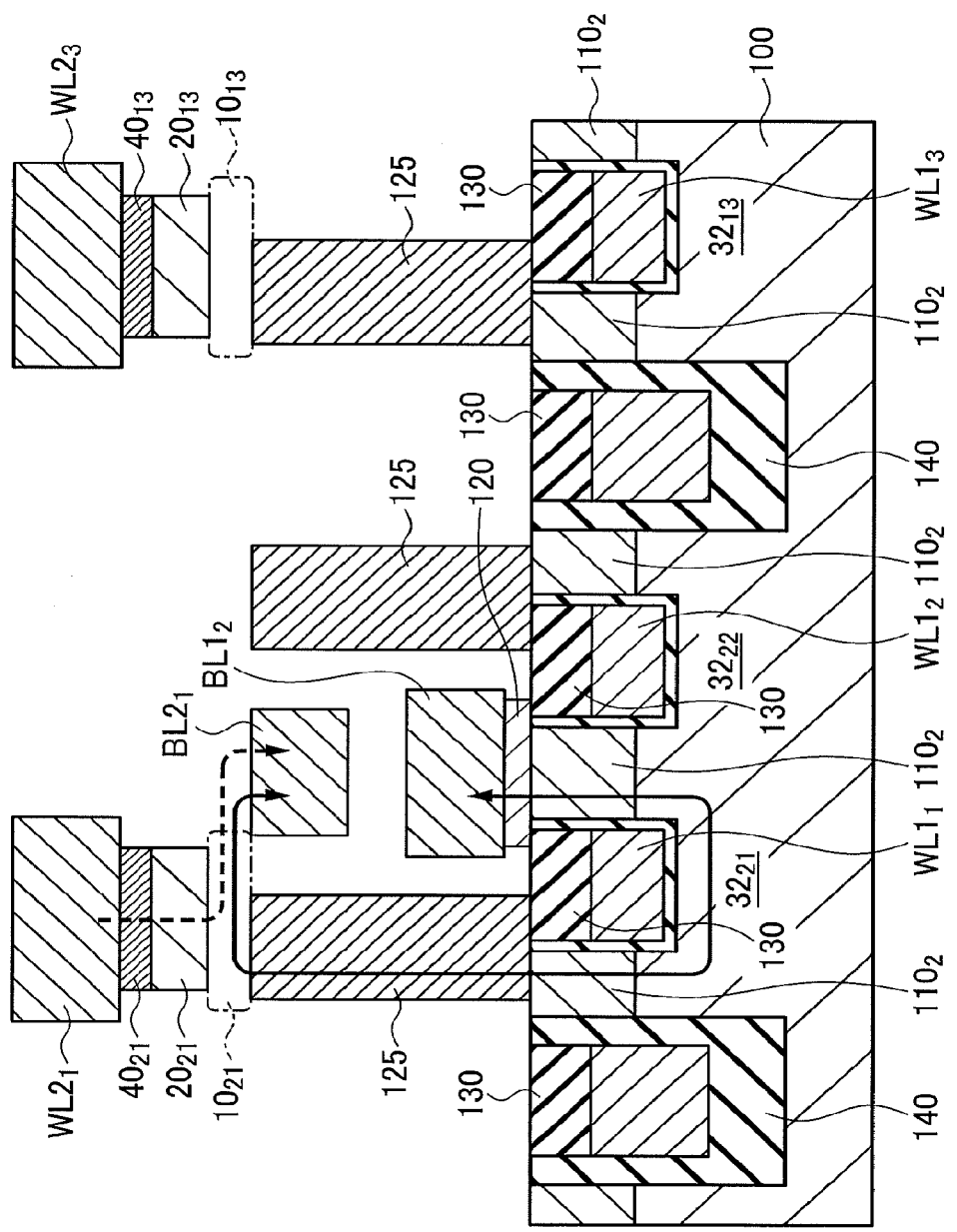
FIG. 17 is a cross-sectional view taken along the section line A-A defined in FIG. 16.

FIG. 17 is a cross-sectional view of the active region $110_2$, taken along the section line A-A defined in FIG. 16. The transistors in the memory cells, which are the transistors $32_{21}$, $32_{22}$, and $32_{13}$ shown in FIG. 17, for example, are transistors of a recessed channel array transistor (RCAT) type, or recessed transistors. However, transistors of some other type may be used. The first bit line $BL1_2$ is connected to one region (an N$^+$-region) of the source and drain regions of the transistor $32_{21}$ via a contact 120. To the left of this region, the gate wiring line $WL1_1$ of the transistor $32_{21}$ and the other region of the source and drain regions are located. To the other region, a contact 125, the nonmagnetic layer $10_{21}$, the MTJ element $20_{21}$, the diode $40_{21}$, and the second word line $WL2_1$ are connected in this order. Meanwhile, the opposite side of the nonmagnetic layer $10_{21}$ is connected to the second bit line $BL2_1$. The site at which the nonmagnetic layer $10_{21}$ and the second bit line $BL2_1$ are connected to each other is at a distance from the portion shown in FIG. 17.

In FIG. 17, the write current path to the MTJ element $20_{21}$ is indicated by a solid line. As the voltages are set as shown in FIG. 5, the write current is applied from the first bit line $BL1_2$ to the nonmagnetic layer $10_{21}$ via the transistor $32_{21}$, and flows into the second bit line $BL2_1$. Current can be applied at both polarities, and the information "0" or the information "1" can be written.

Meanwhile, the read current path is indicated by a dashed line. As the potentials are set as shown in FIG. 6, the read current is applied from the second word line $WL2_1$ to the second bit line $BL2_1$ via the diode $40_{21}$, the MTJ element $20_{21}$, and the nonmagnetic layer $10_{21}$.

Figure 18:
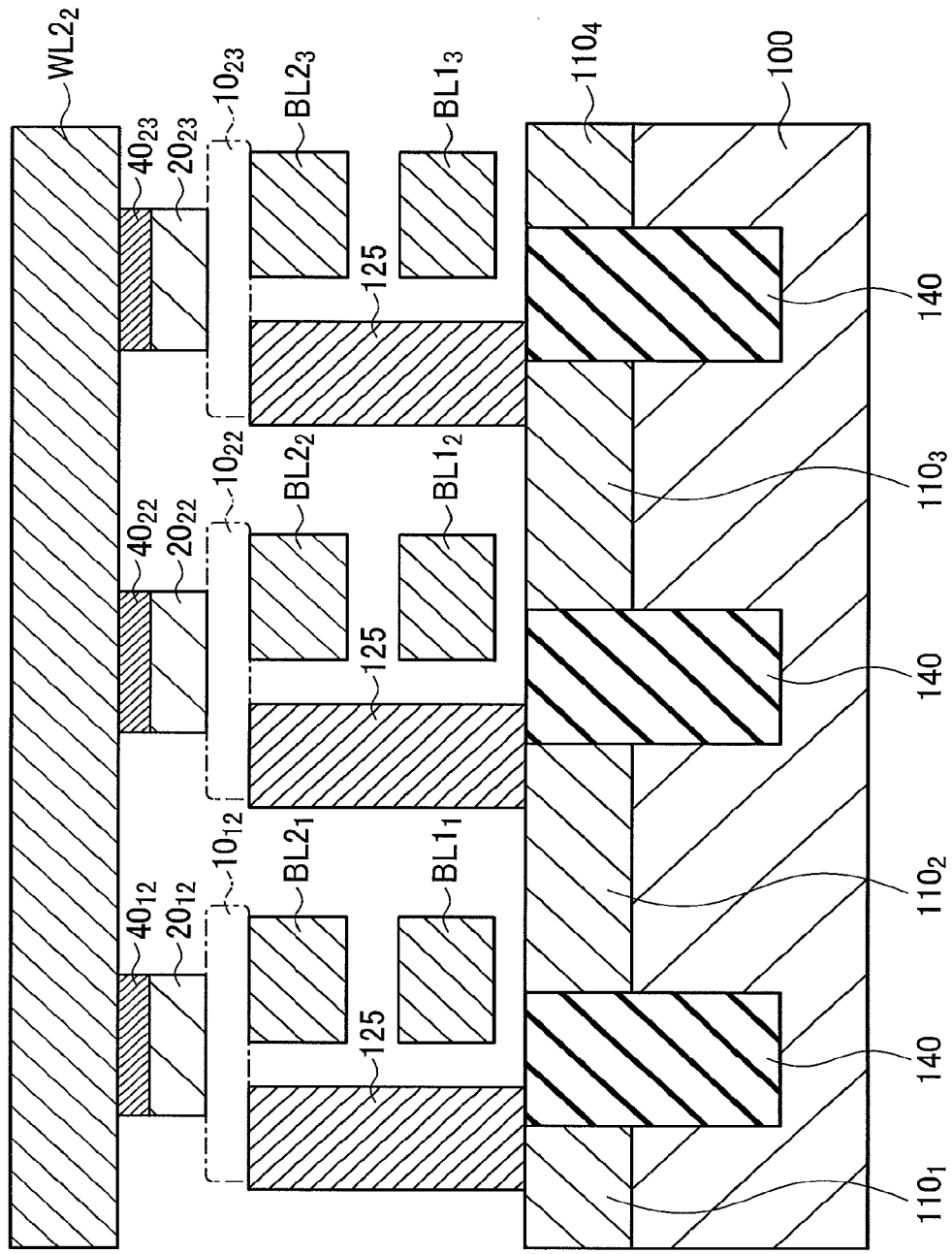
FIG. 18 is a cross-sectional view taken along the section line B-B defined in FIG. 16.

FIG. 18 is a cross-sectional view of the second word line $WL2_2$, taken along the section line B-B defined in FIG. 16.

The first bit lines BL1$_i$ (i=1, 2, 3) and the second bit lines BL2$_i$ self-align and form a protection film, so as not to come into electrical contact with the contacts 125.

(Diode)

Figure 19B:
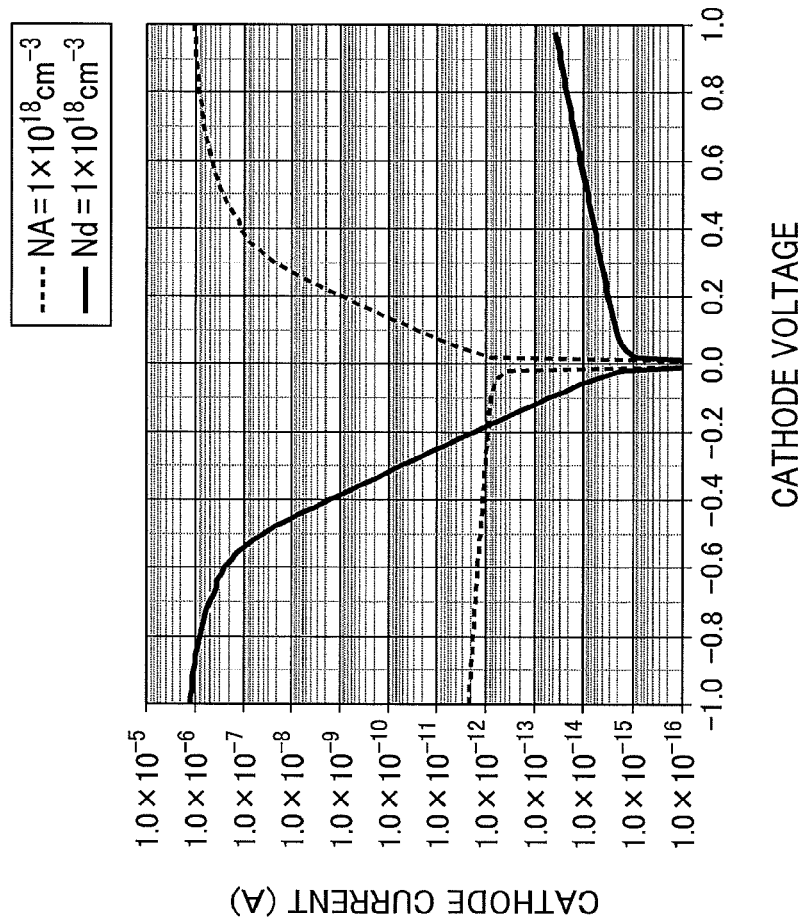
FIGS. 19A and 19B are diagrams showing the size and the characteristics of a diode.
Figure 19A:
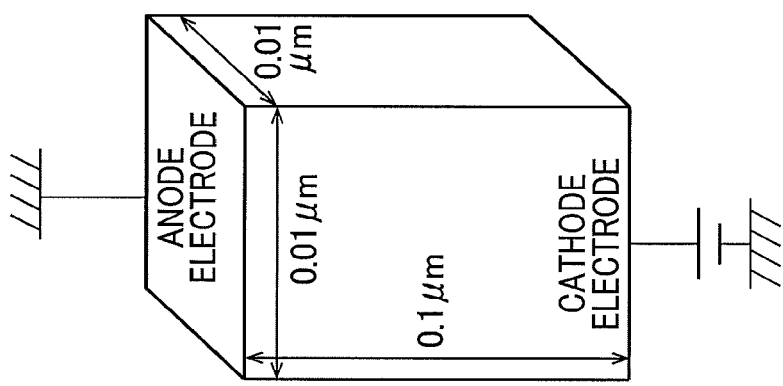

To avoid stray current, a diode preferably has a current ratio of five or more digits between a forward voltage and a reverse bias. Also, to apply a read current, the current at the time of application of a forward voltage of about 1 V is preferably not lower than 1 µA, for example. A simulation was conducted on a schottky diode with such characteristics. FIG. 19A is a diagram showing the shape and the size of the diode used in this simulation. FIG. 19B is a graph showing the simulation results. This simulation was based on the assumption that a schottky barrier was provided at the interface of the anode electrode, and voltage was applied to the cathode to obtain the results. This simulation was also based on the assumption that donors or acceptors were uniformly distributed. As the impurity concentration was adjusted to $1\times10^{18}$ cm$^{-3}$, a forward current of 1 µA or higher was obtained, in spite of the small element size of 10 nm (0.01 µm)×10 nm (0.01 µm). Also, a current ratio of five digits was obtained between the forward voltage and the reverse bias.

Figure 20B:
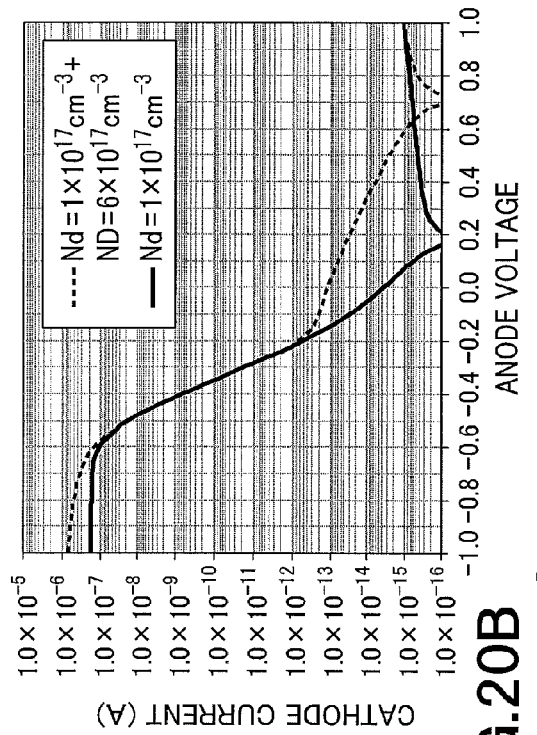
FIGS. 20A and 20C are diagrams showing the size and the characteristics of a diode.
Figure 20C:
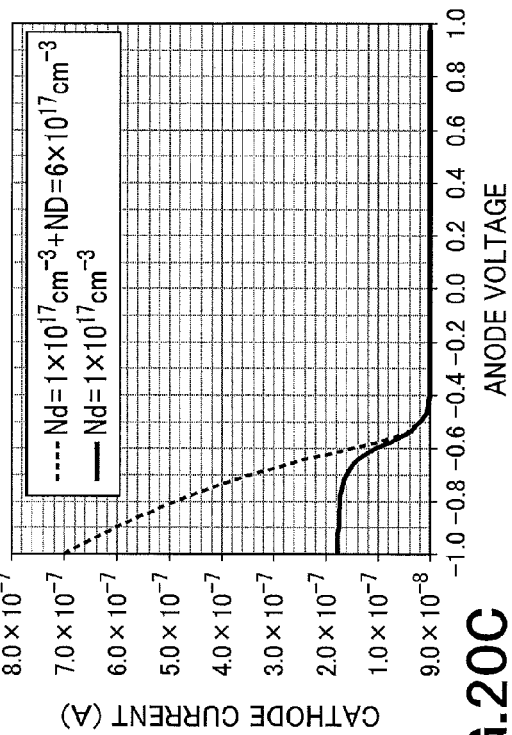
Figure 20A:
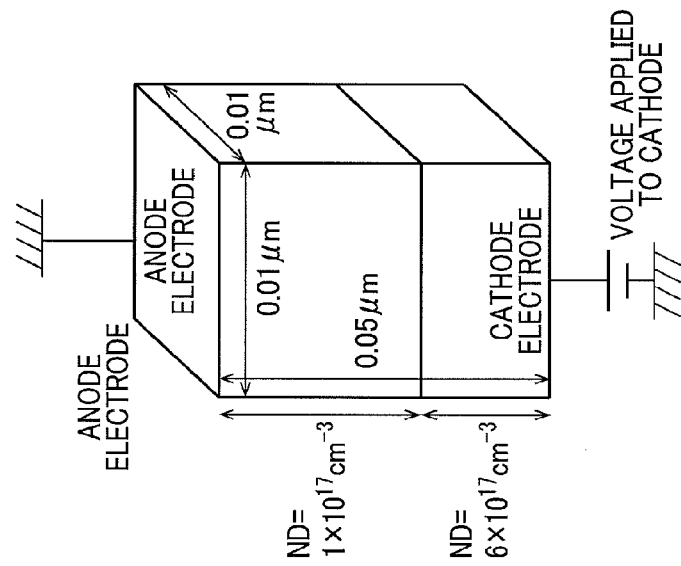

FIG. 20A shows a thinned schottky diode, and FIGS. 20B and 20C show the results of a simulation on the thinned schottky diode. As can be seen from FIG. 20A, this schottky diode also supposedly has a schottky barrier at the interface of the anode electrode.

In a case where donors or acceptors are uniformly distributed in silicon (or polysilicon), an increase in the thickness of the silicon (or polysilicon) normally leads to a larger electrical field, if the dopant concentration is high. As a result, current cannot be applied even with the reverse bias. On the other hand, to avoid current application with the reverse bias, it is necessary to lower the dopant concentration. In such a case, however, the current at the time of forward voltage application becomes lower.

To counter this, a thin high-concentration layer is provided on the cathode side, so that a higher current can be achieved at the time of forward voltage application while the increase in current at the time of reverse bias application is reduced, as shown in FIGS. 20A through 20C.

In a diode using silicon, annealing at approximately 700 degrees centigrade might be necessary for activation. However, the anneal resistance of the magnetic materials forming an MTJ element is approximately 400 degrees centigrade. Therefore, the characteristics of the magnetic materials might be degraded due to annealing. In view of this, annealing may be performed on a diode on a different substrate from that of an MTJ element, and the substrates may be then joined to each other, to electrically connect the diode to the MTJ element.

Figure 21A:
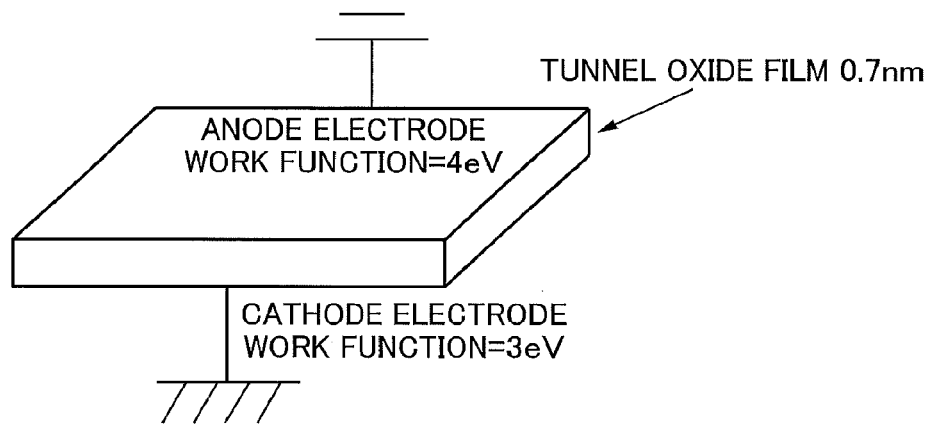
FIGS. 21A and 21B are diagrams showing the size and the characteristics of an MIM diode.
Figure 21B:
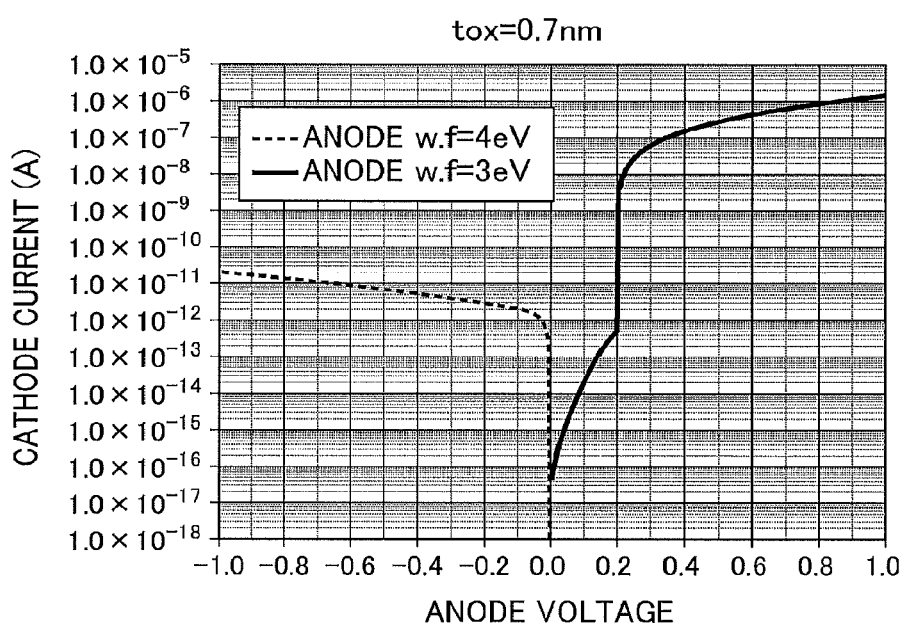

It is also possible to use an MIM (Metal-Insulator-Metal) diode. Referring now to FIGS. 21A through 22B, this aspect is described. To achieve rectifying properties with an MIM diode, electrodes made of materials with different work functions are provided at the metals on both sides of an insulator. FIG. 21A is a perspective view of a first example of an MIM diode. In the MIM diode of the first example, the work functions of the anode electrode and the cathode electrode are 4 eV and 3 eV, respectively, and the thickness tox of the tunnel oxide film is 0.7 nm. FIG. 21B shows the I-V characteristics in this case. Where the element size is 10 nm$^2$, a current of 1 µA is obtained with a forward voltage, and the current with a reverse bias is approximately five digits lower than the current with the forward voltage.

Figure 22A:
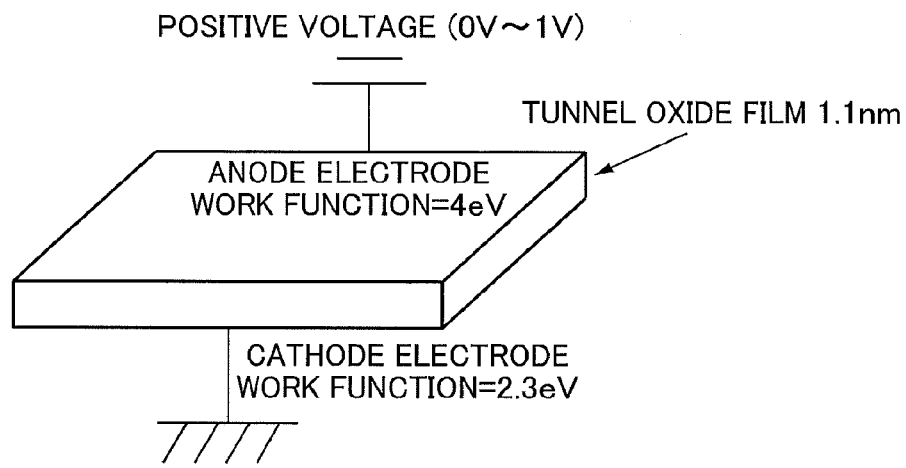
FIGS. 22A and 22B are diagrams showing the size and the characteristics of an MIM diode.
Figure 22B:
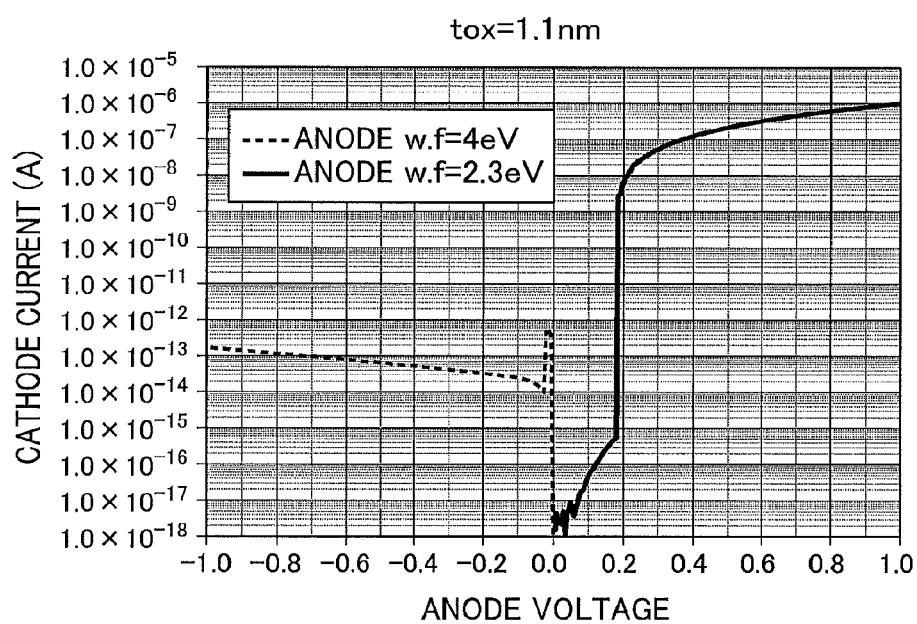

FIG. 22A is a perspective view of a second example of an MIM diode. In the MIM diode of the second example, the work functions of the anode electrode and the cathode electrode are 4 eV and 2.3 eV, respectively, and the thickness tox of the tunnel oxide film is 1.1 nm. FIG. 22B shows the I-V characteristics in this case. In a case where the thickness tox of the tunnel oxide film is 1.1 nm as in the second example, the work functions of the anode electrode and the cathode electrode are adjusted to 4 eV and 2.3 eV, respectively, to achieve the necessary characteristics. Because of the restrictions imposed by the simulator used in this example, a device simulation could not be conducted unless a silicon substrate was used. Therefore, a silicon substrate was doped with acceptors at a high concentration, and was regarded as a metal in the simulation.

As described above, this embodiment can provide memory cells with a reduced cell size, and a magnetic memory including the memory cells.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A magnetic memory comprising:
    a conductive layer including a first terminal, a second terminal, and a portion located between the first terminal and the second terminal;
    a magnetoresistive element including: a first magnetic layer having a fixed magnetization; a second magnetic layer having a changeable magnetization and being disposed between the portion and the first magnetic layer; and a nonmagnetic layer between the first magnetic layer and the second magnetic layer;
    a diode including a third terminal and a fourth terminal, the third terminal being electrically connected to the first magnetic layer;
    a transistor including fifth and sixth terminals and a control terminal, the fifth terminal being electrically connected to the first terminal; and
    a circuit electrically connected to the second terminal, the fourth terminal, the sixth terminal, and the control terminal,
    wherein
    when information is to be written into the second magnetic layer, the circuit switches on the transistor, applies a reverse bias to the diode, and supplies current between the second terminal and the sixth terminal, and
    when information is to be read from the second magnetic layer, the circuit switches off the transistor, and supplies current between the second terminal and the fourth terminal.

2. The memory according to claim 1, further comprising:
    a first wiring electrically connected to the second terminal, and a second wiring electrically connected to the fourth terminal,
    wherein a direction from a source toward a drain of the transistor intersects with respective directions in which the first wiring and the second wiring extend.

3. The memory according to claim 1, wherein the diode is a schottky diode or an MIM diode, the MIM diode having two electrodes with different work functions.

4. The memory according to claim 1, wherein the diode is a schottky diode having an uneven impurity concentration.

5. The magnetic memory according to claim 1, wherein the transistor is a recessed transistor.

6. The magnetic memory according to claim 1, further comprising:
a first wiring electrically connected to the second terminal, a second wiring electrically connected to the fourth terminal, a third wiring electrically connected to the sixth terminal, and a fourth wiring electrically connected to the control terminal,
wherein the first and third wirings extend in a first direction, and the second and fourth wirings extend in a second direction.

7. The magnetic memory according to claim 1, further comprising:
a first wiring electrically connected to the second terminal, a second wiring electrically connected to the fourth terminal, a third wiring electrically connected to the sixth terminal, and a fourth wiring electrically connected to the control terminal,
wherein a direction in which the first wiring extends intersects with respective directions in which the second and fourth wirings extend, and a direction in which the third wiring intersects with respective directions in which the second and fourth wirings extend.

8. The magnetic memory according to claim 1, wherein the circuit includes a first circuit electrically connected to the fourth terminal and the control terminal, and a second circuit electrically connected to the second terminal and the sixth terminal.

9. A magnetic memory comprising:
a conductive layer including a first terminal, a second terminal, and a portion located between the first terminal and the second terminal;
a magnetoresistive element including: a first magnetic layer having a fixed magnetization; a second magnetic layer having a changeable magnetization and being disposed between the portion and the first magnetic layer; and a nonmagnetic layer between the first magnetic layer and the second magnetic layer;
a bidirectional diode including a third terminal and a fourth terminal, the third terminal being electrically connected to the first magnetic layer;
a transistor including fifth and sixth terminals and a control terminal, the fifth terminal being electrically connected to the first terminal; and
a circuit electrically connected to the second terminal, the fourth terminal, the sixth terminal, and the control terminal,
wherein
when information is to be written into the second magnetic layer, the circuit switches on the transistor, applies a voltage equal to or less than a threshold value to the bidirectional diode, and supplies current between the second terminal and the sixth terminal, and
when information is to be read from the second magnetic layer, the circuit switches off the transistor, and supplies current between the second terminal and the fourth terminal.

10. The memory according to claim 9, further comprising:
a first wiring electrically connected to the second terminal and a second wiring electrically connected to the fourth terminal, wherein a direction from a source toward a drain of the transistor intersects with respective directions in which the first wiring and the second wiring extend.

11. The magnetic memory according to claim 9, wherein the transistor is a recessed transistor.

12. The magnetic memory according to claim 9, further comprising:
a first wiring electrically connected to the second terminal, a second wiring electrically connected to the fourth terminal, a third wiring electrically connected to the sixth terminal, and a fourth wiring electrically connected to the control terminal,
wherein the first and third wirings extend in a first direction, and the second and fourth wirings extend in a second direction.

13. The magnetic memory according to claim 9, further comprising:
a first wiring electrically connected to the second terminal, a second wiring electrically connected to the fourth terminal, a third wiring electrically connected to the sixth terminal, and a fourth wiring electrically connected to the control terminal, wherein a direction in which the first wiring extends intersects with respective directions in which the second and fourth wirings extend, and a direction in which the third wiring intersects with respective directions in which the second and fourth wirings extend.

14. The magnetic memory according to claim 9, wherein the circuit includes a first circuit electrically connected to the fourth terminal and the control terminal, and a second circuit electrically connected to the second terminal and the sixth terminal.

* * * * *

UNITED STATES PATENT AND TRADEMARK OFFICE
CERTIFICATE OF CORRECTION

PATENT NO. : 9,830,968 B2  
APPLICATION NO. : 15/266120  
DATED : November 28, 2017  
INVENTOR(S) : Naoharu Shimomura et al.

Page 1 of 1

It is certified that error appears in the above-identified patent and that said Letters Patent is hereby corrected as shown below:

On the Title Page

Item (*) and Item (45) are incorrect.

Item (*) should read:

The first or sole Notice should read --

Subject to any disclaimer, the term of this patent is extended or adjusted under 35 U.S.C. 154(b) by 0 days.

And Item (45) should read:

-- (45) Date of Patent:  Nov. 28, 2017 --

Signed and Sealed this  
Twenty-fifth Day of June, 2019

Andrei Iancu  
*Director of the United States Patent and Trademark Office*